US012805202B2

(12) United States Patent
van der Straten et al.

(10) Patent No.: US 12,805,202 B2
(45) Date of Patent: Nov. 17, 2026

(54) MRAM DEVICE WITH ASYMMETRIC ELECTRODES

(71) Applicant: INTERNATIONAL BUSINESS MACHINES CORPORATION, Armonk, NY (US)

(72) Inventors: Oscar van der Straten, Guilderland Center, NY (US); Mark Lucarelli, Schenectady, NY (US); Willie Lester Muchrison, Jr., Troy, NY (US); Chih-Chao Yang, Glenmont, NY (US)

(73) Assignee: International Business Machines Corporation, Armonk, NY (US)

( * ) Notice: Subject to any disclaimer, the term of this patent is extended or adjusted under 35 U.S.C. 154(b) by 407 days.

(21) Appl. No.: 18/536,316

(22) Filed: Dec. 12, 2023

(65) Prior Publication Data

US 2025/0194432 A1 Jun. 12, 2025

(51) Int. Cl.
*H10N 50/80* (2023.01)
*H10B 61/00* (2023.01)
*H10N 50/01* (2023.01)
*H10N 50/10* (2023.01)

(52) U.S. Cl.
CPC ............. *H10N 50/80* (2023.02); *H10B 61/10* (2023.02); *H10N 50/01* (2023.02); *H10N 50/10* (2023.02)

(58) Field of Classification Search
CPC ........ H10B 61/00; H10B 61/10; H10D 48/40; H10N 50/01; H10N 50/10; H10N 50/80; G01R 15/20; G01R 15/207; G01R 33/09; G01R 33/098; G11B 5/37; G11B 5/39; G11B 5/3909; G11C 11/161
See application file for complete search history.

(56) References Cited

U.S. PATENT DOCUMENTS

| | | | | |
|---|---|---|---|---|
| 9,502,640 | B1 | 11/2016 | Annunziata | |
| 9,559,294 | B2 | 1/2017 | Hsu | |
| 9,608,195 | B2 | 3/2017 | Huang | |
| 11,374,167 | B2 | 6/2022 | Frougier | |
| 2009/0209050 | A1 | 8/2009 | Wang | |
| 2011/0049655 | A1 | 3/2011 | Assefa | |
| 2015/0035096 | A1* | 2/2015 | Han | H10B 61/22 257/421 |
| 2021/0280776 | A1* | 9/2021 | Frougier | H10N 50/80 |
| 2022/0109099 | A1 | 4/2022 | Rizzolo | |
| 2023/0200086 | A1 | 6/2023 | Van Der Straten | |

* cited by examiner

*Primary Examiner* — Cheung Lee
(74) *Attorney, Agent, or Firm* — Harrity & Harrity, LLP

(57) ABSTRACT

A semiconductor device including a magnetic tunnel junction (MTJ) stack and a bottom electrode below the MTJ stack, where a portion of a bottom electrode is vertically aligned with a portion of the MTJ stack and a remaining portion of the bottom electrode extends horizontally beyond the MTJ stack. A semiconductor device including a MTJ stack and a bottom electrode below the MTJ stack, where a portion of a bottom electrode is vertically aligned with a portion of the MTJ stack and a remaining portion of the bottom electrode of the MTJ stack extends horizontally beyond the MTJ stack, where the bottom electrode comprises an interior void. A method including forming a MTJ stack on a sacrificial layer, a portion of a sacrificial layer is vertically aligned with a portion of the MTJ stack and a remaining portion of the sacrificial layer extends horizontally beyond the MTJ stack.

18 Claims, 22 Drawing Sheets

Section X-X

Section X-X

Section X-X

Section X-X

Section X-X

Section X-X

Section X-X

Section X-X

Section X-X

Section X-X

Section X-X

Section X-X

Section X-X

Section X-X

Section X-X

Section X-X

Section X-X

Section X-X

Section X-X

Section X-X

MRAM DEVICE WITH ASYMMETRIC ELECTRODES

BACKGROUND

The present invention relates, generally, to the field of semiconductor manufacturing, and more particularly to fabricating a magnetic tunnel junction device with asymmetric electrodes.

Magneto resistive random-access memory ("MRAM") devices are used as non-volatile computer memory. MRAM data is stored by magnetic storage elements. The elements are formed from two ferromagnetic layers, each of which can hold a magnetic field, separated by a spin conductor layer. One of the two layers is a reference magnet, or a reference layer, set to a particular polarity, while the remaining layer's field can be changed to match that of an external field to store memory and is termed the "free magnet" or "free-layer". This configuration is known as the magnetic tunnel junction (MTJ) and is the simplest structure for a MRAM bit of memory.

SUMMARY

According to an embodiment of the present invention, a semiconductor device is provided. The semiconductor device including a magnetic tunnel junction (MTJ) stack, and a bottom electrode, where a portion of the bottom electrode is vertically aligned with a portion of the MTJ stack and a remaining portion of the bottom electrode extends horizontally beyond the MTJ stack.

According to an embodiment of the present invention, a semiconductor device is provided. The semiconductor device including magnetic tunnel junction (MTJ) stack, and a bottom electrode, where a portion of a bottom electrode is vertically aligned with a portion of the MTJ stack and a remaining portion of the bottom electrode extends horizontally beyond the MTJ stack, where the bottom electrode includes an interior void.

According to an embodiment of the present invention, a method is provided. The method including forming a magnetic tunnel junction (MTJ) stack on a sacrificial layer, a portion of a sacrificial layer is vertically aligned with a portion of the MTJ stack and a remaining portion of the sacrificial layer extends horizontally beyond the MTJ stack.

BRIEF DESCRIPTION OF THE DRAWINGS

The following detailed description, given by way of example and not intended to limit the invention solely thereto, will best be appreciated in conjunction with the accompanying drawings, in which.

The drawings are not necessarily to scale. The drawings are merely schematic representations, not intended to portray specific parameters of the invention. The drawings are intended to depict only typical embodiments of the invention. In the drawings, like numbering represents like elements.

DETAILED DESCRIPTION

Figure 1:
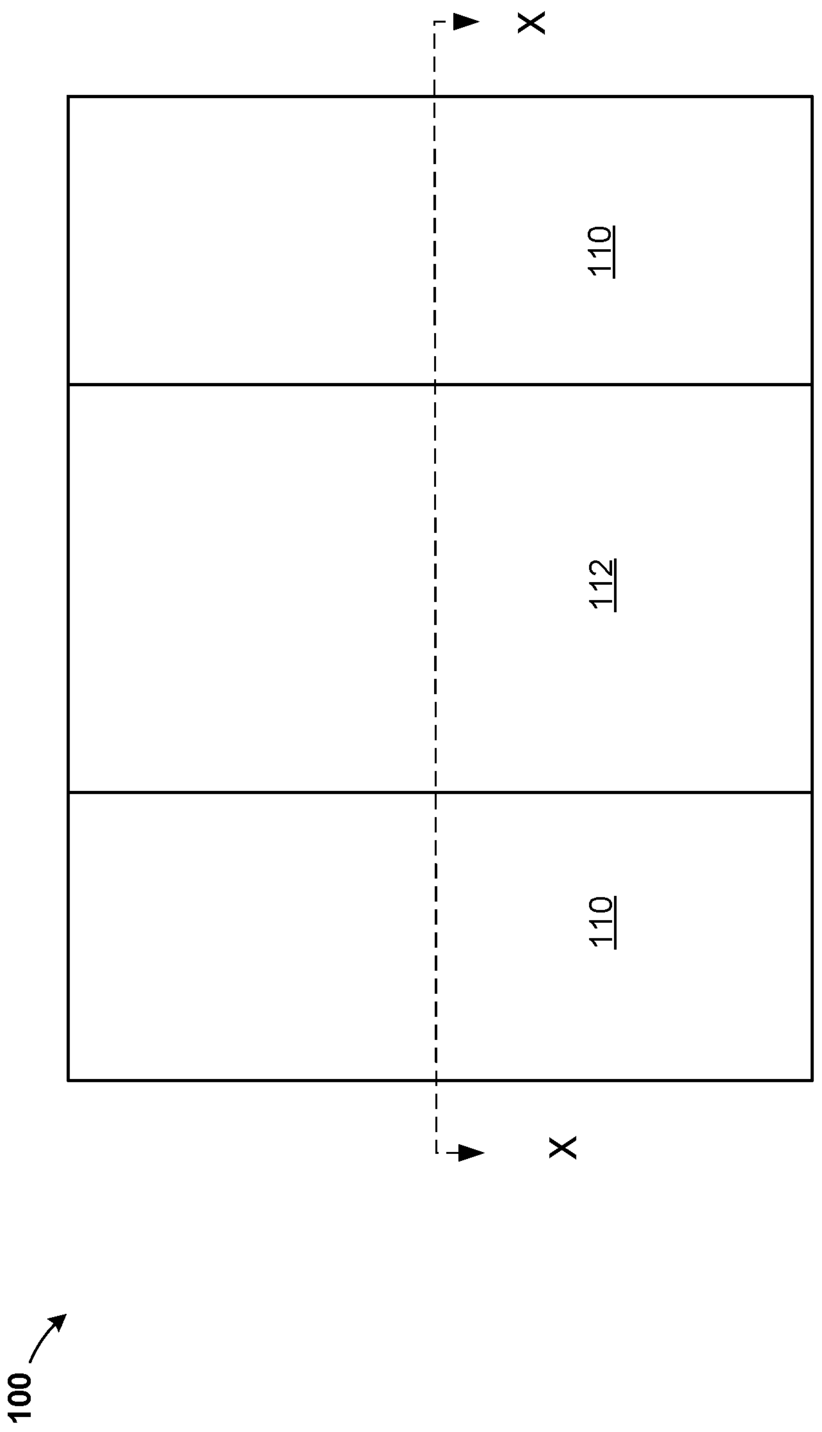
FIGS. 1 and 2 illustrate a top view and a cross-sectional view along section line X-X, respectively, of a semiconductor structure at an intermediate point of fabrication, according to an exemplary embodiment.

Detailed embodiments of the claimed structures and methods are disclosed herein; however, it can be understood that the disclosed embodiments are merely illustrative of the claimed structures and methods that may be embodied in various forms. This invention may, however, be embodied in many different forms and should not be construed as limited to the exemplary embodiment set forth herein. Rather, these exemplary embodiments are provided so that this disclosure will be thorough and complete and will fully convey the scope of this invention to those skilled in the art. In the description, details of well-known features and techniques may be omitted to avoid unnecessarily obscuring the presented embodiments.

For purposes of the description hereinafter, the terms "upper", "lower", "right", "left", "vertical", "horizontal", "top", "bottom", and derivatives thereof shall relate to the disclosed structures and methods, as oriented in the drawing figures. The terms "overlying", "atop", "on top", "positioned on" or "positioned atop" mean that a first element, such as a first structure, is present on a second element, such as a second structure, wherein intervening elements, such as an interface structure may be present between the first element and the second element. The term "direct contact" means that a first element, such as a first structure, and a second element, such as a second structure, are connected without any intermediary conducting, insulating or semiconductor layers at the interface of the two elements.

The terms substantially, substantially similar, about, or any other term denoting functionally equivalent similarities refer to instances in which the difference in length, height, or orientation convey no practical difference between the definite recitation (e.g. the phrase sans the substantially similar term), and the substantially similar variations. In one embodiment, substantial (and its derivatives) denote a difference by a generally accepted engineering or manufacturing tolerance for similar devices, up to, for example, 10% deviation in value or 10° deviation in angle.

In the interest of not obscuring the presentation of embodiments of the present invention, in the following detailed description, some processing steps or operations that are known in the art may have been combined together for presentation and for illustration purposes and in some instances may have not been described in detail. In other instances, some processing steps or operations that are known in the art may not be described at all. It should be understood that the following description is rather focused on the distinctive features or elements of various embodiments of the present invention.

As stated above, magneto resistive random-access memory (hereinafter "MRAM") devices are a non-volatile computer memory technology. MRAM data is stored by magnetic storage elements. The elements are formed from two ferromagnetic layers, each of which can hold a magnetic field, separated by a spin conductor layer. One of the two layers is a reference magnet, or a reference layer, set to a particular polarity, while the remaining layer's field can be changed to match that of an external field to store memory and is termed the "free magnet" or "free-layer". The magnetic reference layer may be referred to as a reference layer, and the remaining layer may be referred to as a free layer. This configuration is known as the magnetic tunnel junction (hereinafter "MTJ") and is the simplest structure for a MRAM bit of memory.

A memory device is built from a grid of such memory cells or bits. In some configurations of MRAM, such as the type further discussed herein, the magnetization of the magnetic reference layer is fixed in one direction (up or down), and the direction of the magnetic free layer can be switched by external forces, such as an external magnetic field or a spin-transfer torque generating charge current. A smaller current (of either polarity) can be used to read resistance of the device, which depends on relative orientations of the magnetizations of the magnetic free layer and the magnetic reference layer. The resistance is typically higher which the magnetizations are anti-parallel and lower when they are parallel, though this can be reversed, depending on materials used in fabrication of the MRAM.

The MRAM stack layers may be conformally formed using known techniques. The reference layer is formed. The tunneling barrier layer is formed on the reference layer. In an embodiment, the tunneling barrier layer is a barrier, such as a thin insulating layer or electric potential, between two electrically conducting materials. Electrons (or quasiparticles) pass through the tunneling barrier layer by the process of quantum tunneling. In certain embodiments, the tunneling barrier layer includes at least one sublayer composed of magnesium oxide (MgO). It should be appreciated that materials other than MgO can be used to form the tunneling barrier layer. The free layer is a magnetic free layer that is adjacent to tunneling barrier layer and opposite the reference layer. The free layer has a magnetic moment or magnetization that can be flipped. It should also be appreciated that the MTJ stack layers may include additional layers, omit certain layers, and each of the layers may include any number of sublayers. Moreover, the composition of layers and/or sublayers may be different between the different MRAM stacks.

For high performance MRAM devices based on perpendicular magnetic tunnel junction (MTJ) structures, well-defined interfaces and interface control are essential. MTJ structures typically include a cobalt (Co) based synthetic anti-ferromagnet (SAF), a CoFeB-based reference layer, a MgO-based tunnel barrier, a CoFeB-based free layer, and cap layers containing e.g. tantalum (Ta) and/or ruthenium (Ru). Embedded MTJ structures are usually formed by patterning of blanket MTJ stacks. Reactive ion etch (RIE), and ion beam etch (IBE) processing of such MTJ stacks presents a major challenge, as it typically leads to shorts due to re-sputtering of thick bottom metal layers onto MTJ stack sidewalls. There is a need for embedded MTJ structures formed by methods with a reduced risk of shorts due to metal re-sputtering.

Embedded MTJ structures are usually formed on a bottom electrode (BE) by subtractive patterning of blanket MTJ stacks into pillars between two metal levels. Typically, a polycrystalline metal is applied as hardmask material for subtractive patterning of blanket MTJ stacks. Grain boundaries/defects in the polycrystalline metal hardmask can be transferred into the MTJ pillar during patterning, resulting in MTJ pillars with high CER (circular edge roughness) which can negatively impact MRAM performance. There is a need for embedded MTJ structures formed by methods with reduced CER.

This invention discloses novel asymmetric electrodes. The asymmetric electrodes are aligned with one edge and a portion of the MTJ pillar or MTJ stack. A sacrificial material is used as a placeholder for the bottom electrode. The asymmetric electrodes are formed after patterning the MTJ pillar. This invention reduces the risk of shorts due to metal re-sputtering as the electrodes are formed after patterning the MTJ pillar and forming an encapsulation layer surrounding vertical side surface of the MTJ pillar. This invention provides a low CER by using a dielectric for patterning of the MTJ pillar. This lowers the CER due to the amorphous microstructure (i.e., microstructure without grain boundaries) of the dielectric used for patterning.

This invention extends scalability of MRAM/memory elements due to enlarged process window for MRAM stack patterning by allowing over-etching during RIE or IBE steps into the underlying substrate, without the risk of metal re-sputtering from the underlying substrate.

This invention improves performance of embedded MRAM due to reduced tunnel barrier shorts and lowering the CER.

After forming a lower metal wire with a metal cap, or other embedded layers, a first inter-layer dielectric is formed. A portion of the first inter-layer dielectric is removed and a sacrificial dielectric is formed where the portion of the first inter-layer dielectric was removed. The sacrificial dielectric is aligned with and formed on a portion of the lower metal wire with the metal cap. Layers of the MTJ stack are formed. A dielectric top layer is formed on the layers of the MTJ stack and is patterned. In an embodiment, the dielectric top layer includes hafnium oxide ($HfO2$). The MTJ stack is patterned relative to the dielectric top layer. There is no risk of metal re-sputtering as there is no exposed metal. The patterning mask is dielectric material rather than a metallic material, helping to remove metal re-sputtering. The bottom dielectric is not yet formed. The MTJ stack overlaps a portion of the sacrificial dielectric. The dielectric top layer is removed. An encapsulation layer is formed and portions removed such that remaining portions remain on vertical side surfaces of the MTJ stack. A second inter-layer dielectric is formed. Portions of the second inter-layer dielectric are removed. A portion of an upper horizontal surface of the MTJ stack is exposed and a portion of a vertical side surface of the MTJ stack is exposed. A portion of an upper horizontal surface of the sacrificial layer below the MTJ stack is exposed. The sacrificial layer is removed. A metal liner is formed, which is formed along exposed vertical surfaces and horizontal surfaces where the sacrificial layer is removed, forming the bottom electrode. In an embodiment, the bottom electrode may have a void in a center portion of the bottom electrode. A metal fill is formed and the structure is planarized. The metal fill and the portions of the metal liner along vertical side surfaces of the MTJ stack are removed. A third inter-layer dielectric is formed along the vertical side surfaces of the MTJ stack. A top electrode is formed. An upper metal wire may be formed.

The present invention relates, generally, to the field of semiconductor manufacturing, and more particularly to fabricating a magnetic tunnel junction device with asymmetric electrodes.

Embodiments of the present invention disclosing a structure and a method of forming a magnetic tunnel junction device with asymmetric electrodes are described in detail below by referring to the accompanying drawings in FIGS. 1-22, in accordance with an illustrative embodiment.

Figure 2:
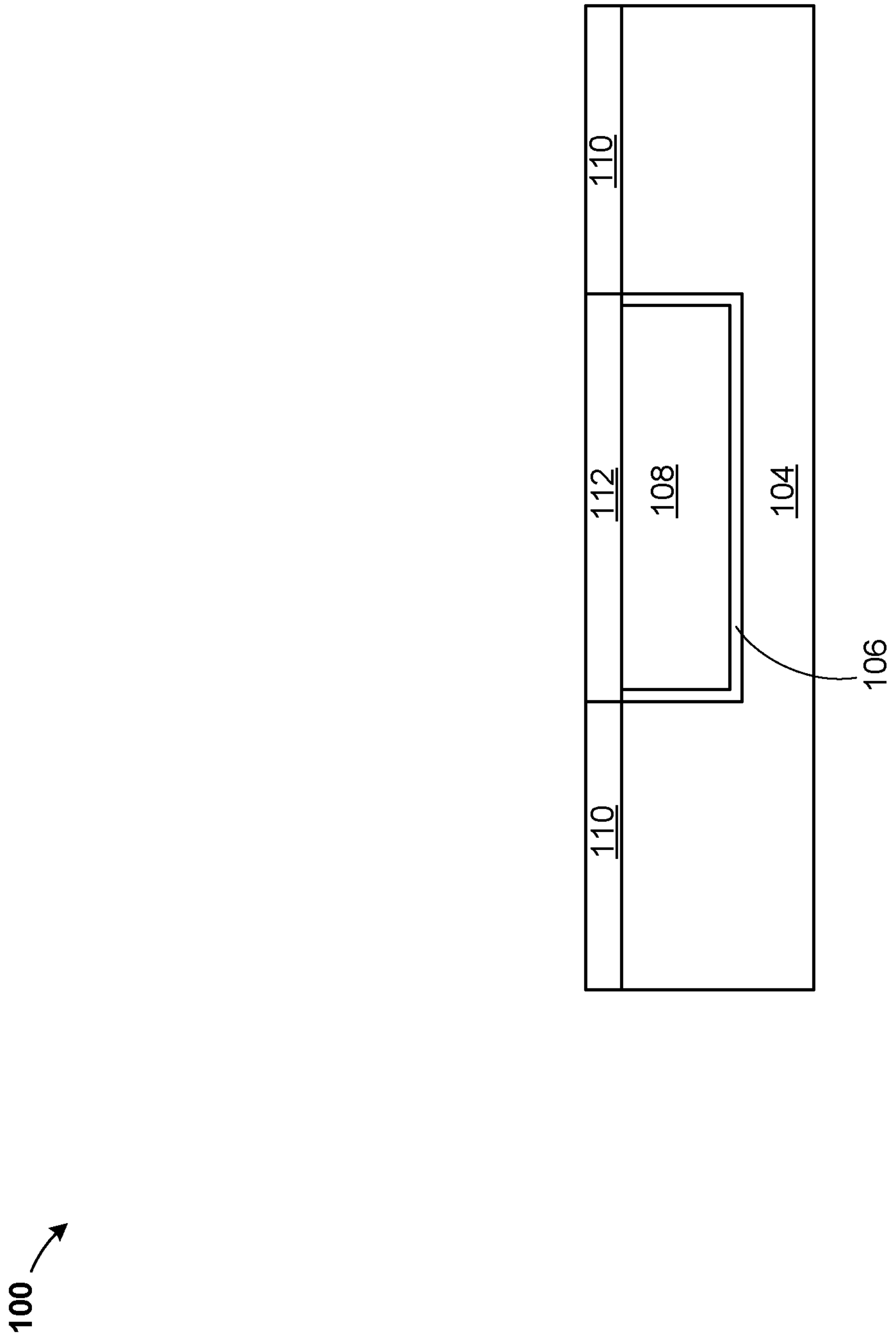

Referring now to FIGS. 1 and 2, a semiconductor structure 100 (hereinafter "structure") at an intermediate stage of fabrication is shown according to an exemplary embodiment. FIG. 1 is a top view of the structure 100. FIG. 2 is a cross-sectional view of the structure 100 along section line X-X. The structure 100 may be formed or provided. The structure 100 includes, for example, an inter-layer dielectric (hereinafter "ILD") 104, a metal liner 106, a lower metal wire 108, an inter-layer dielectric (hereinafter "ILD") 110, and a metal cap 112.

The structure 100 may include several back end of line ("BEOL") layers (not shown). In general, the back end of line (BEOL) is the second portion of integrated circuit fabrication where the individual devices (transistors, capacitors, resistors, etc.) are interconnected with wiring on the wafer.

The ILD 104 may be formed by depositing or growing a dielectric material on the BEOL layers (not shown), followed by a chemical mechanical polishing (CMP) or etch steps. The ILD 104 may be deposited using typical deposition techniques, for example, atomic layer deposition (ALD), molecular layer deposition (MLD), chemical vapor deposition (CVD), physical vapor deposition (PVD), high density plasma (HDP) deposition, and spin on techniques, followed by a planarization process, such as CMP, or any suitable etch process. In an embodiment, the ILD 104 may include one or more layers. In an embodiment, the ILD 104 may include any dielectric material such as silicon oxide (SiOx), silicon nitride (SiNx), silicon boron carbonitride (SiBCN), NBLOK, a low-k dielectric material (with $k<4.0$), including but not limited to, silicon oxide, spin-on-glass, a flowable oxide, a high-density plasma oxide, borophosphosilicate glass (BPSG), or any combination thereof or any other suitable dielectric material.

The lower metal wire 108 may be formed by first patterning a trench (not shown) into the ILD 104, lining the trench with the metal liner 106, and filling the trench.

The metal liner 106 separates the conductive interconnect material of the lower metal wire 108 from the ILD 104. The metal liner 106 may be composed of, for example, tantalum nitride (TaN), tantalum (Ta), titanium (Ti), or a combination thereof. The metal liner 106 may be deposited utilizing a conventional deposition process such as, for example, CVD, plasma enhanced chemical vapor deposition (PECVD), PVD or ALD. The metal liner 106 may be 5 nm thick, although a thickness less than or greater than 5 nm may be acceptable. The metal liner 106 surrounds a lower horizontal surface and a vertical side surface of the lower metal wire 108.

In an embodiment, the lower metal wire 108 is formed from a conductive material layer which is blanket deposited on top of the structure 100, and directly on a top surface of the metal liner 106, filling the trench (not shown). The conductive material layer may include materials such as, for example copper (Cu), ruthenium (Ru), cobalt (Co), tungsten (W). The conductive material can be formed by for example, chemical vapor deposition (CVD), physical vapor deposition (PVD), and atomic layer deposition (ALD) or a combination thereof. The lower metal wire 108 is formed by damascene, or patterned from the conductive material layer, using known patterning and etching techniques. There may be any number of openings in the ILD 104, each filled with the metal liner 106 and the lower metal wire 108, on the structure 100.

A planarization process, such as, for example, chemical mechanical polishing (CMP), may be done to remove excess material from a top surface of the structure 100 such that upper horizontal surfaces of the lower metal wire 108, the metal liner 106 and the ILD 104 are coplanar.

In an embodiment, the lower metal wire 108 may have a thickness ranging from about 10 nm to about 100 nm, although a thickness less than 10 nm and greater than 100 nm may be acceptable.

The ILD 110 may be formed as described for the ILD 104, directly on a top surface of the metal liner 106, the lower metal wire 108 and the ILD 104. The metal cap 112 may be formed by first patterning a trench (not shown) into the ILD 110 vertically aligned above the lower metal wire 108 and the metal liner 106, and filling the trench. The ILD 110 is unlikely to contain voids as the ILD 110 is blanket deposited on the planarized upper surface of the lower metal wire 108 and the metal liner 106.

In an embodiment, the metal cap 112 is formed from a conductive material layer which is blanket deposited on top of the structure 100, and directly on a top surface of the ILD 110, the metal liner 106, the lower metal wire 108 and the ILD 104. The conductive material layer may include materials such as, for example tantalum (Ta), ruthenium (Ru), titanium (Ti), tungsten (W). The conductive material can be formed by for example, chemical vapor deposition (CVD), physical vapor deposition (PVD), and atomic layer deposition (ALD) or a combination thereof. The metal cap 112 is formed by damascene, or patterned from the conductive material layer, using known patterning and etching techniques. Damascene is the method of BEOL interconnect formation. A dielectric is deposited, patterned, and the resulting feature is metallized. Any metal overburden is removed by planarization.

A planarization process, such as, for example, chemical mechanical polishing (CMP), may be done to remove excess material from a top surface of the structure 100 such that upper horizontal surfaces of the metal cap 112 and the ILD 110 are coplanar.

Figure 3:
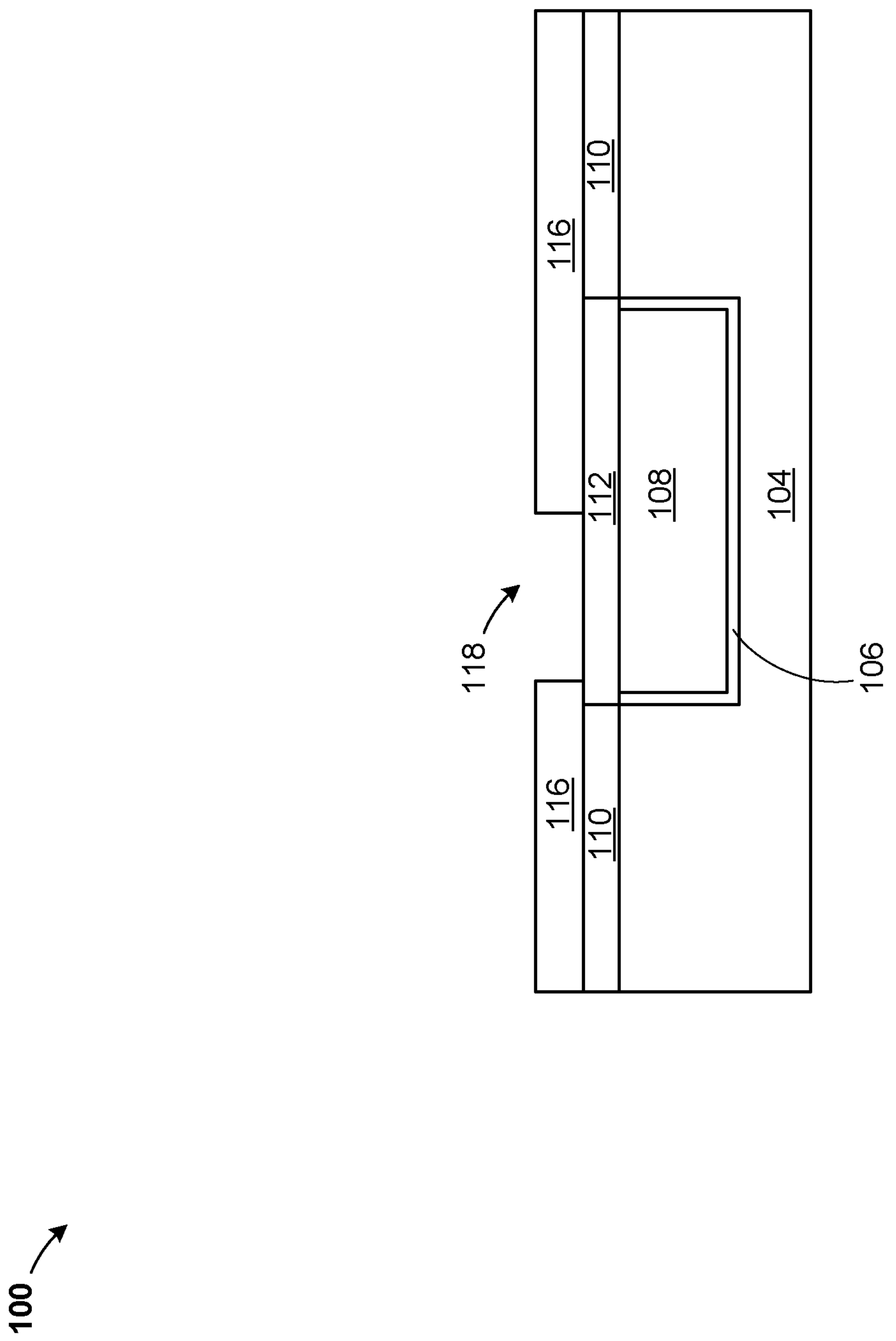
FIG. 3 illustrates a cross-sectional view along section line X-X of the semiconductor structure and illustrates formation of an inter-layer dielectric and patterning of the inter-layer dielectric, according to an exemplary embodiment.

Referring now to FIG. 3, a cross-sectional view of the structure 100 is shown along section line X-X, according to an embodiment. An inter-layer dielectric (hereinafter "ILD") 116 may be formed. An opening 118 may be formed.

The ILD 116 may be formed in a manner similar to what is described for the ILD 104, directly on upper horizontal surfaces of the metal cap 112 and the ILD 110. The ILD 116 is unlikely to contain voids as the ILD 116 is blanket deposited on the planarized upper surface of the metal cap 112 and the ILD 110.

A hard mask (not shown) may be formed on the structure 100 and patterned, directly on an upper horizontal surface of the ILD 116. Portions of the ILD 116 may be selectively removed using an anisotropic etching technique such as, for example, reactive ion etching to form the opening 118. The opening 118 may be vertically aligned with and above the metal cap 112 and the lower metal wire 108. An upper horizontal surface of the metal cap 112 is exposed in the opening 118. The hard mask (not shown) may be removed using known techniques.

The opening 118 may be asymmetrically aligned with the lower metal wire 108 and may be in one of two horizontal halves of the lower metal wire 108, as shown. The opening 118 may have a first vertical side surface vertically aligned with a first vertical side surface of the lower metal wire 108 and may have a second vertical side surface which is within half of the width of the lower metal wire 108, such that the opening 118 is entirely within one half of the width of the lower metal wire 108.

Figure 4:
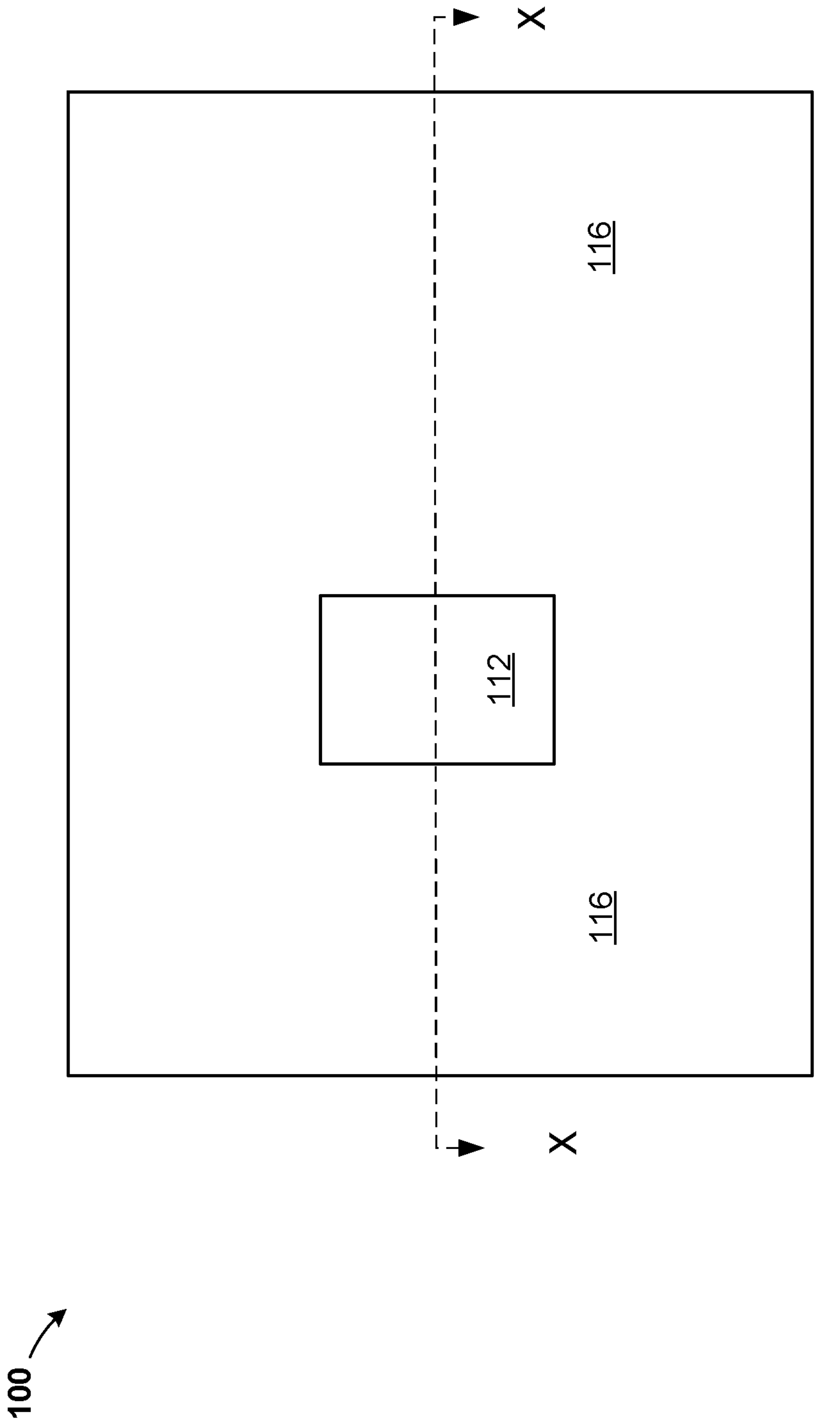
FIGS. 4 and 5 illustrate a top view and a cross-sectional view along section line X-X, respectively, of the semiconductor structure and illustrates formation of a sacrificial layer, according to an exemplary embodiment.
Figure 5:
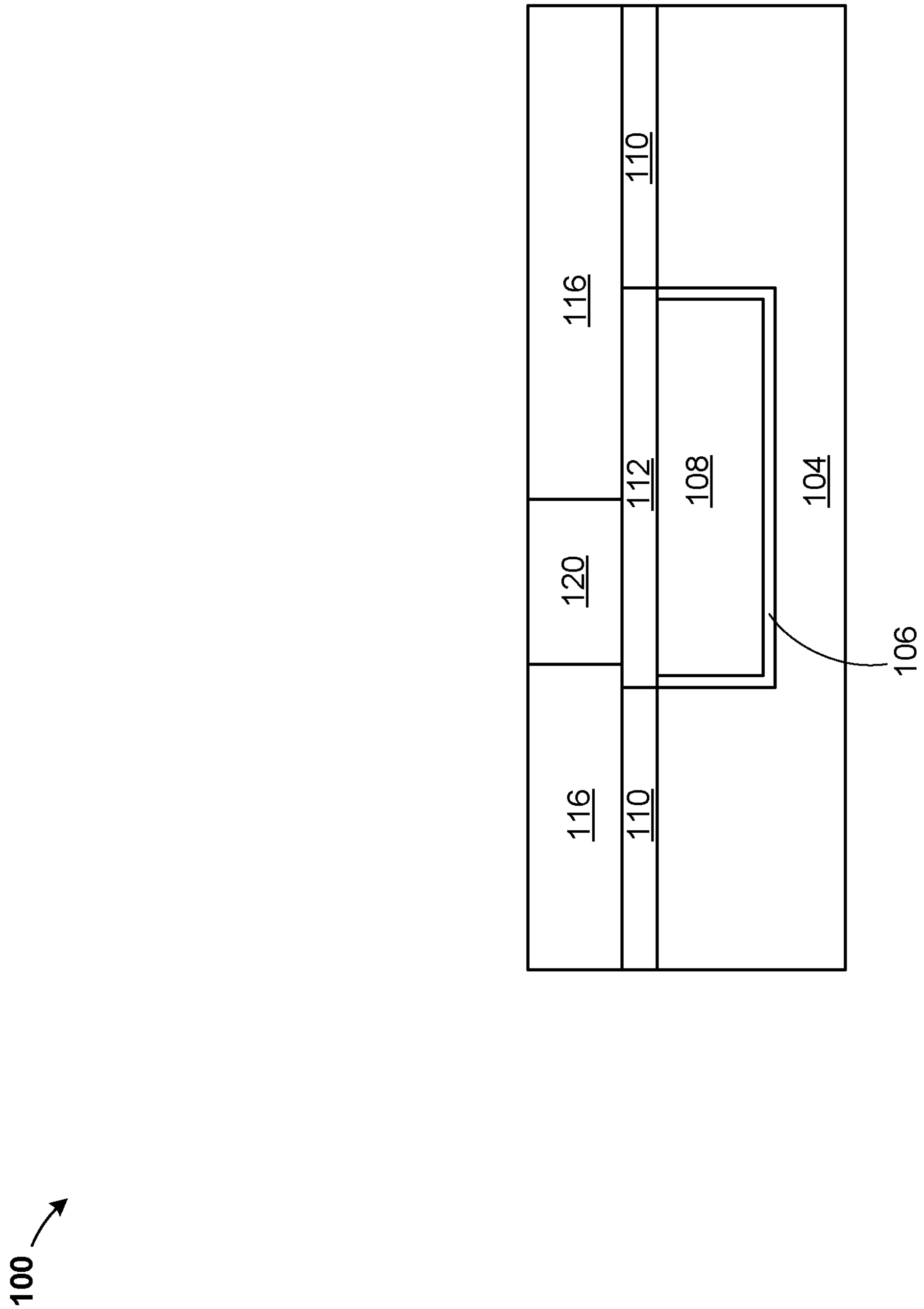

Referring now to FIGS. 4 and 5, a top view and a cross-sectional view of the structure 100 is shown along section line X-X, respectively, according to an embodiment. A sacrificial layer 120 may be formed.

The sacrificial layer 120 may be formed by depositing or growing a dielectric material on the structure 100, followed by planarization process, such as a chemical mechanical polishing (CMP). The sacrificial layer 120 may be deposited using typical deposition techniques, for example, atomic layer deposition (ALD), molecular layer deposition (MLD), chemical vapor deposition (CVD), physical vapor deposition (PVD), high density plasma (HDP) deposition, and spin on techniques, followed by a planarization process, such as CMP, or any suitable etch process. In an embodiment, the sacrificial layer 120 may include one or more layers. In an embodiment, the sacrificial layer 120 may include any dielectric material such as silicon oxide (SiOx), silicon nitride (SiNx), silicon boron carbonitride (SiBCN), NBLoK, a low-k dielectric material (with k<4.0), including but not limited to, silicon oxide, spin-on-glass, a flowable oxide, a high-density plasma oxide, borophosphosilicate glass (BPSG), or any combination thereof or any other suitable dielectric material. In a preferred embodiment, the sacrificial layer 120 includes aluminum oxynitride (AlON) or any material with the characteristics of a metal-oxynitride such as AlON. The sacrificial layer 120 is selected to be a material which can be selectively removed, selective to surrounding material, such as the ILD 116, the ILD 110, the metal cap 112 and other material layers to be formed.

Figure 6:
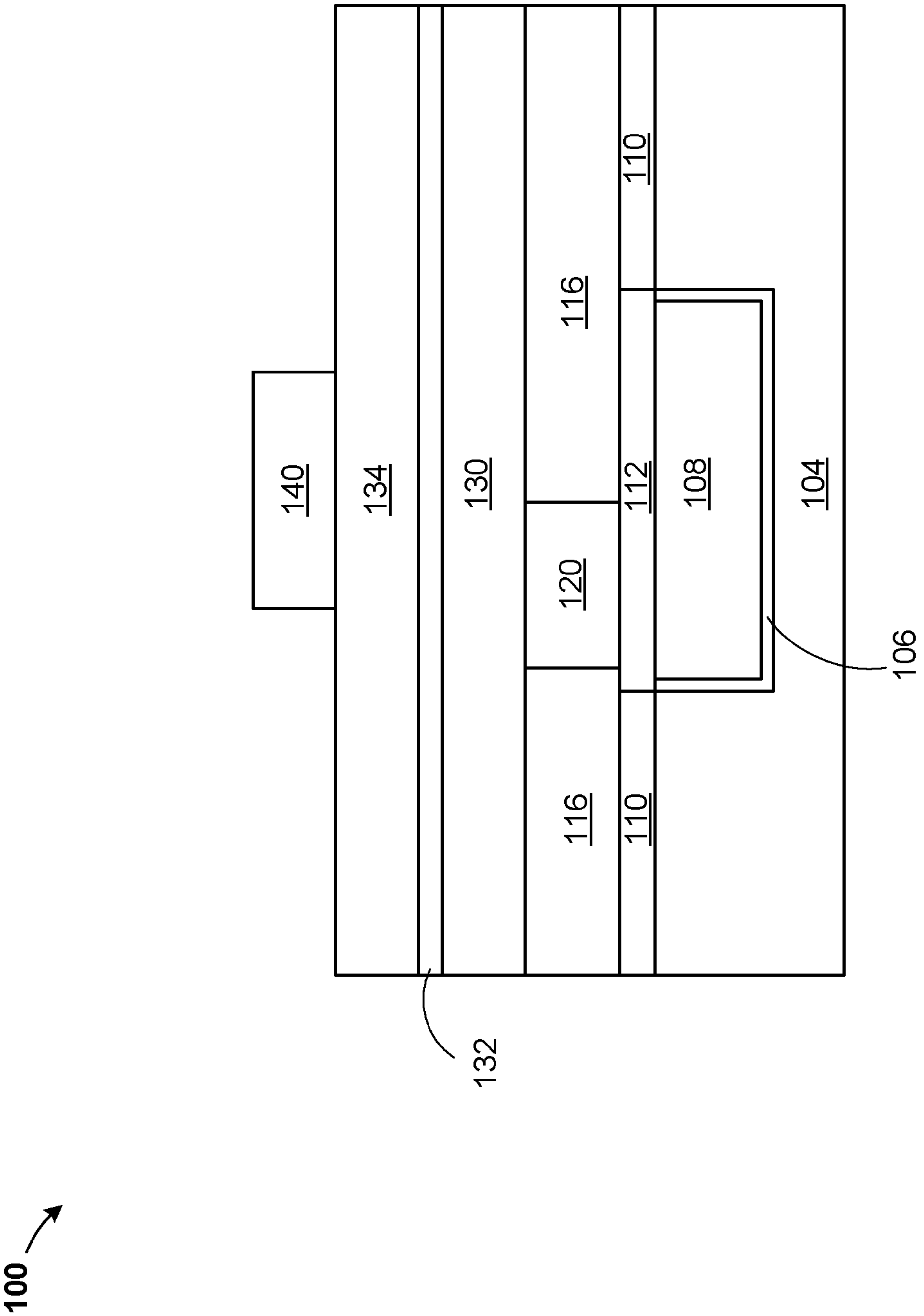
FIG. 6 illustrates a cross-sectional view along section line X-X of the semiconductor structure and illustrates formation of a reference layer, a tunneling barrier, a free layer and a dielectric top layer, according to an exemplary embodiment.

Referring now to FIG. 6, a cross-sectional view of the structure 100 is shown along section line X-X, according to an embodiment. A reference layer 130 may be formed. A tunneling barrier 132 may be formed. A free layer 134 may be formed. A dielectric top layer 140 may be formed.

The reference layer 130 may be formed conformally on the structure 100. The reference layer 130 may cover an upper horizontal surface of the ILD 116 and an upper horizontal surface of the sacrificial layer 120. The tunneling barrier 132 may be formed conformally on the structure 100, on upper horizontal surfaces of the reference layer 130. The free layer 134 may be formed conformally on the structure 100, on upper horizontal surfaces of the tunneling barrier 132.

The dielectric top layer 140 may be formed conformally on an upper horizontal surface of the free layer 134. The dielectric top layer 140 may be formed as described for the ILD 104. In an embodiment, the dielectric top layer 140 may include hafnium oxide ($HfO_2$). As illustrated, portions of the dielectric top layer 140 may be patterned by methods known in the arts. Remaining portions of the dielectric top layer 140 are vertically aligned with the lower metal wire 108. The dielectric top layer 140 is within a perimeter of an extension of vertical lines the lower metal wire 108.

Figure 7:
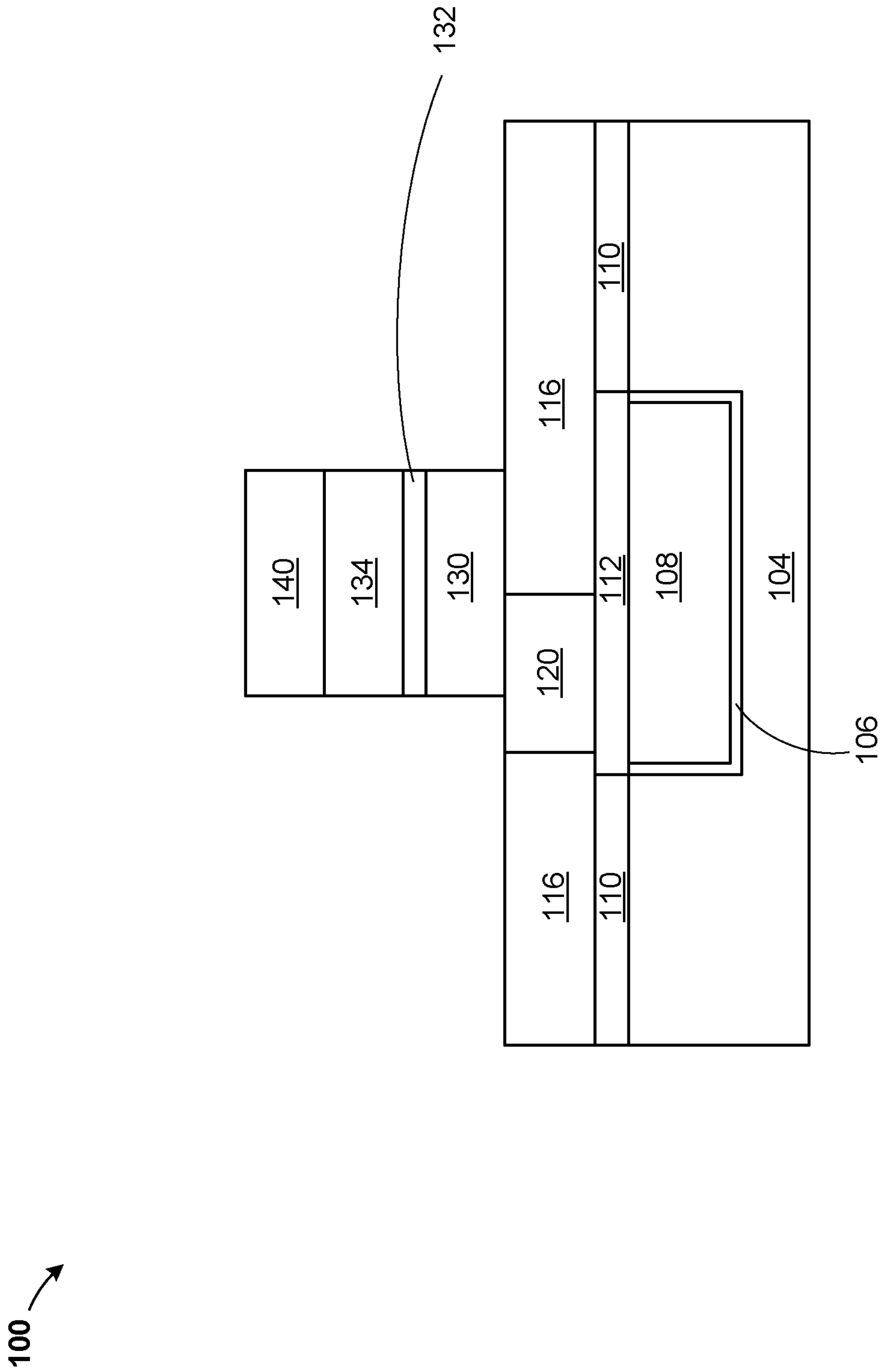
FIG. 7 illustrates a cross-sectional view along section line X-X of the semiconductor structure and illustrates patterning of the free layer, the tunneling barrier and the reference layer, according to an exemplary embodiment.

Referring now to FIG. 7, a cross-sectional view of the structure 100 is shown along section line X-X, according to an embodiment. Portions of the reference layer 130, portions of the tunneling barrier 132 and portions of the free layer 134 may be removed.

The portions of the reference layer 130, the portions of the tunneling barrier 132 and the portions of the free layer 134 may be removed selective to the dielectric top layer 140, and may be selectively removed using an anisotropic etching technique, such as, for example, reactive ion etching. The remaining portions of the reference layer 130, the tunneling barrier 132 and the free layer 134 may remain vertically aligned within a perimeter of an extension of vertical lines the lower metal wire 108. The reference layer 130, the tunneling barrier 132 and the free layer 134 are above and overlap a portion of the sacrificial layer 120.

The reference layer 130, the tunneling barrier 132 and the free layer 134 have vertically aligned vertical side surfaces. A portion of each of the reference layer 130, the tunneling barrier 132 and the free layer 134 covers a portion of the sacrificial layer 120. A remaining portion of each of the reference layer 130, the tunneling barrier 132 and the free layer 134 covers a portion of the ILD 116. The exposed portion of the sacrificial layer 120 is not covered by the reference layer 130, the tunneling barrier 132 and the free layer 134. A remaining portion of the sacrificial layer 120 is covered by the reference layer 130, the tunneling barrier 132 and the free layer 134.

The MTJ stack which includes the reference layer 130, the tunneling barrier 132 and the free layer 134 have low circular edge roughness (CER) due to the material of the dielectric top layer 140 including a dielectric material. Additionally, there is no risk of metal re-sputtering from a bottom electrode during MTJ stack patterning, as the bottom electrode has not yet been formed, and no metal exposed which could re-sputter.

Figure 8:
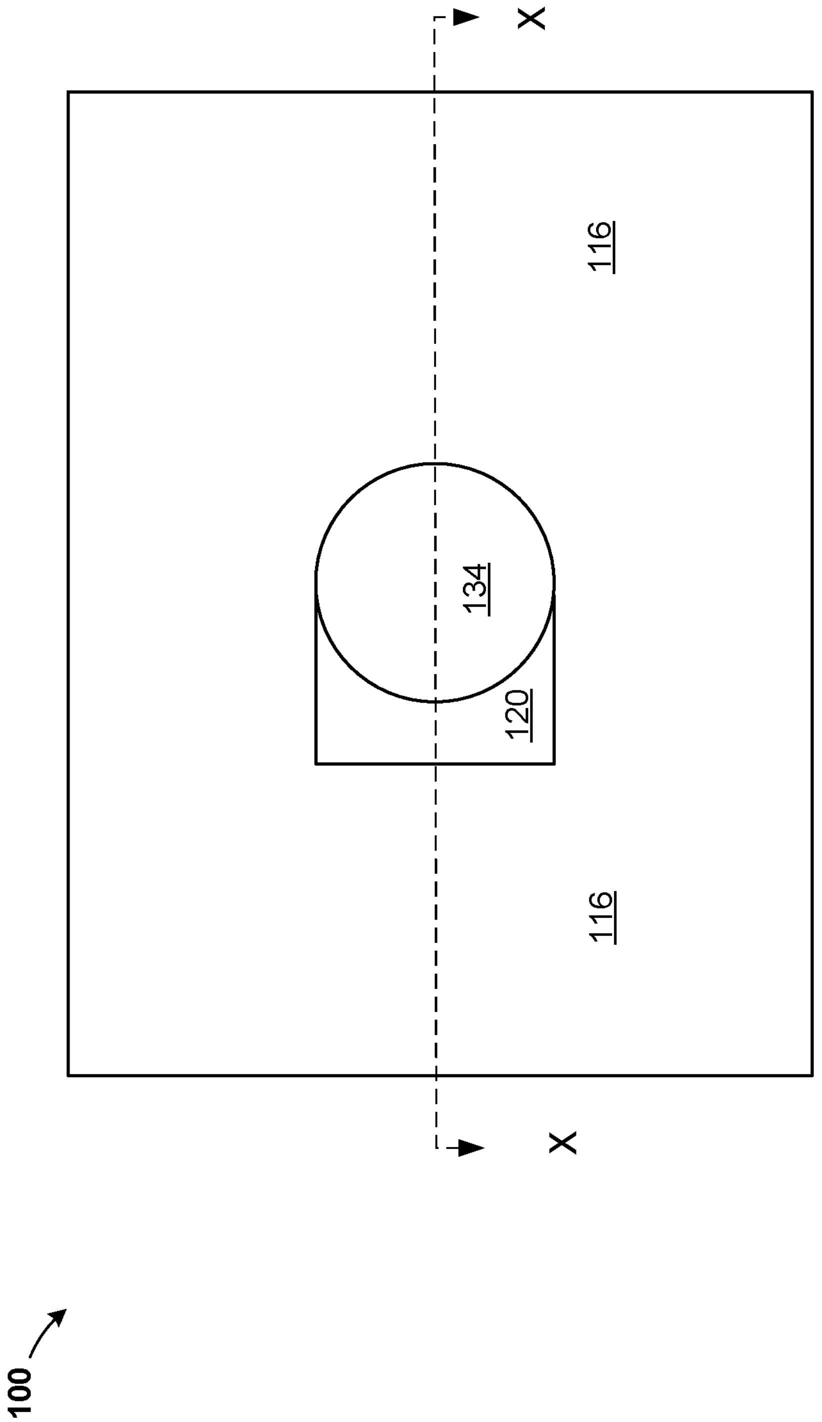
FIGS. 8 and 9 illustrate a top view and a cross-sectional view along section line X-X, respectively, of the semiconductor structure and illustrates removal of the dielectric top layer, according to an exemplary embodiment.
Figure 9:
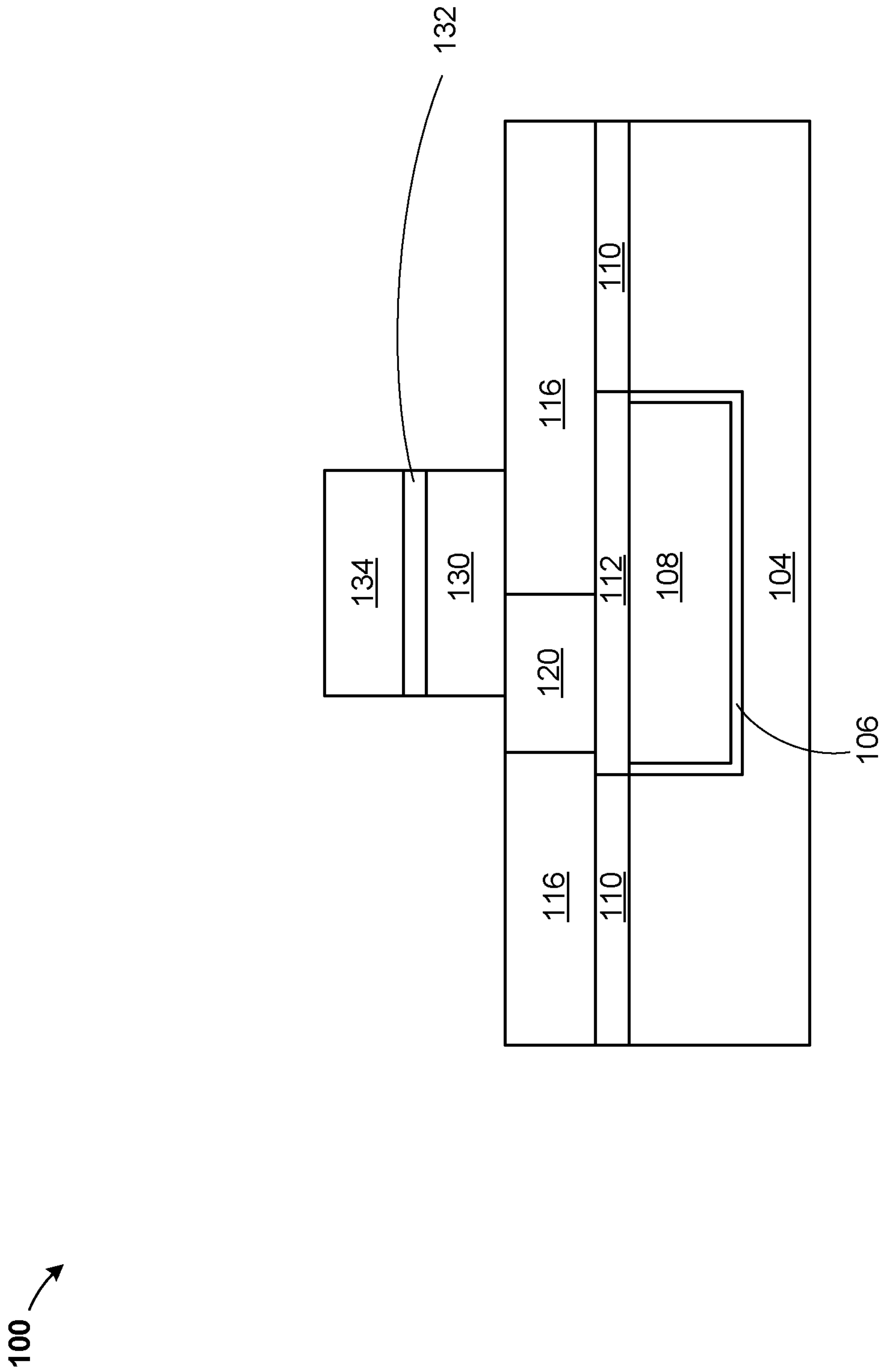

Referring now to FIGS. 8 and 9, a cross-sectional view of the structure 100 is shown along section line X-X, according to an embodiment. The dielectric top layer 140 may be removed using known techniques.

As shown in FIG. 8, the MTJ stack has a circular shape which partially overlaps the sacrificial layer 120.

Figure 10:
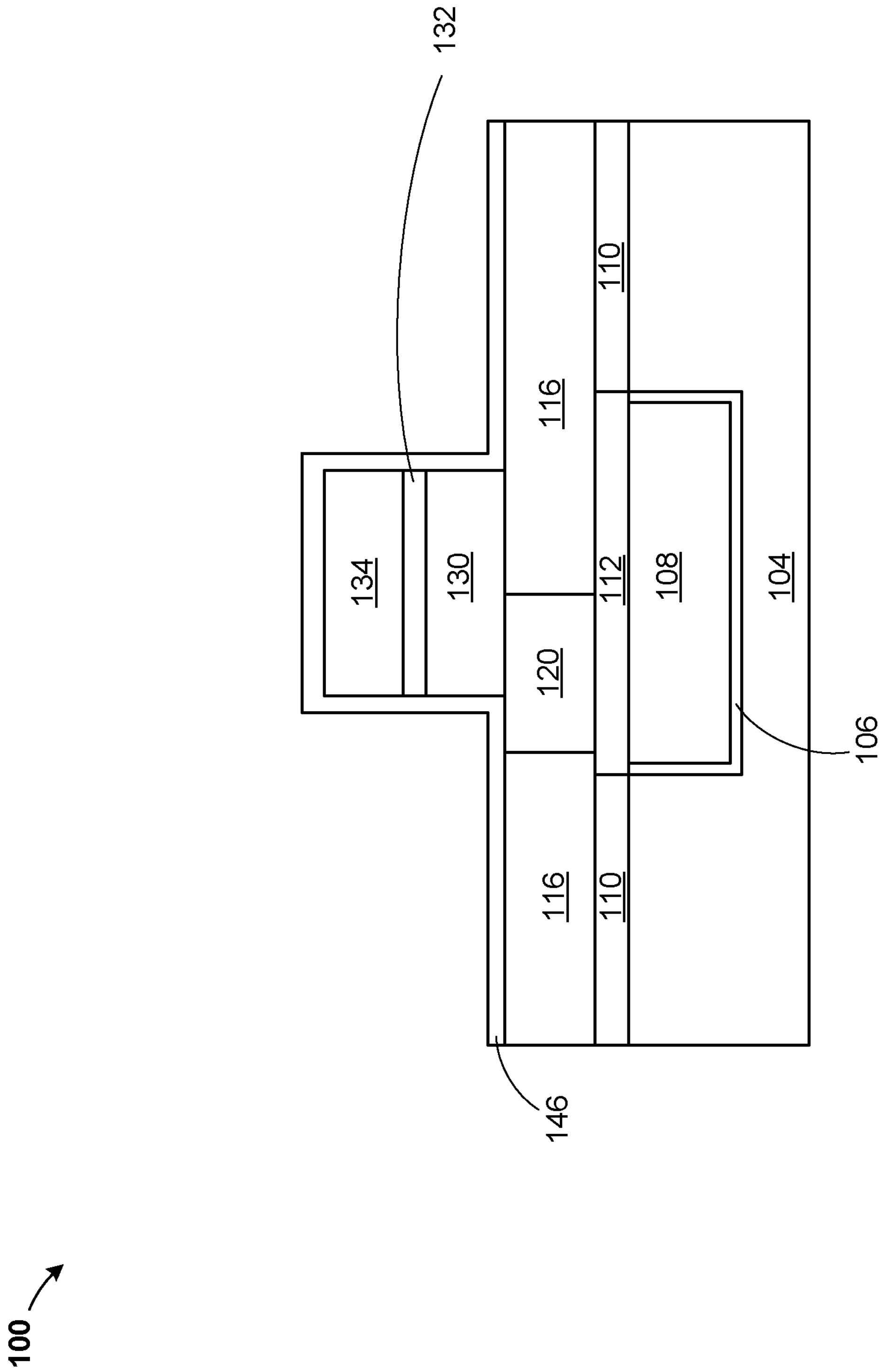
FIG. 10 illustrates a cross-sectional view along section line X-X of the semiconductor structure and illustrates formation of an encapsulation layer, according to an exemplary embodiment.

Referring now to FIG. 10, a cross-sectional view along section line X-X of the structure 100 is shown, according to an embodiment. An encapsulation layer 146 may be formed.

The encapsulation layer 146 may be conformally formed on the structure 100, on an upper horizontal surface of the ILD 116, on a portion of an upper horizontal surface of the sacrificial layer 120, on an upper horizontal surface and vertical side surfaces of the free layer 134, on vertical side surfaces of the tunneling barrier 132 and on vertical side surfaces of the reference layer 130. The encapsulation layer 146 may include materials such as, for example, any dielectric material such as silicon nitride (SiN) and silicon nitride carbon (SiNC) and may include a single layer or may include multiple layers of dielectric material. In an alternate embodiment, the encapsulation layer 146 may include zirconium oxide ($ZrO_2$). The encapsulation layer 146 may be deposited using typical deposition techniques, for example, physical vapor deposition, atomic layer deposition, molecular layer deposition, and chemical vapor deposition. The encapsulation layer 146 may have a thickness between 3 nm and 30 nm, although thickness greater than 30 nm or less than 3 nm are acceptable.

The encapsulation layer 146 helps to protect the reference layer 130, the tunneling barrier 132 and the free layer 134 from being damaged or oxidized during subsequent processing.

Figure 11:
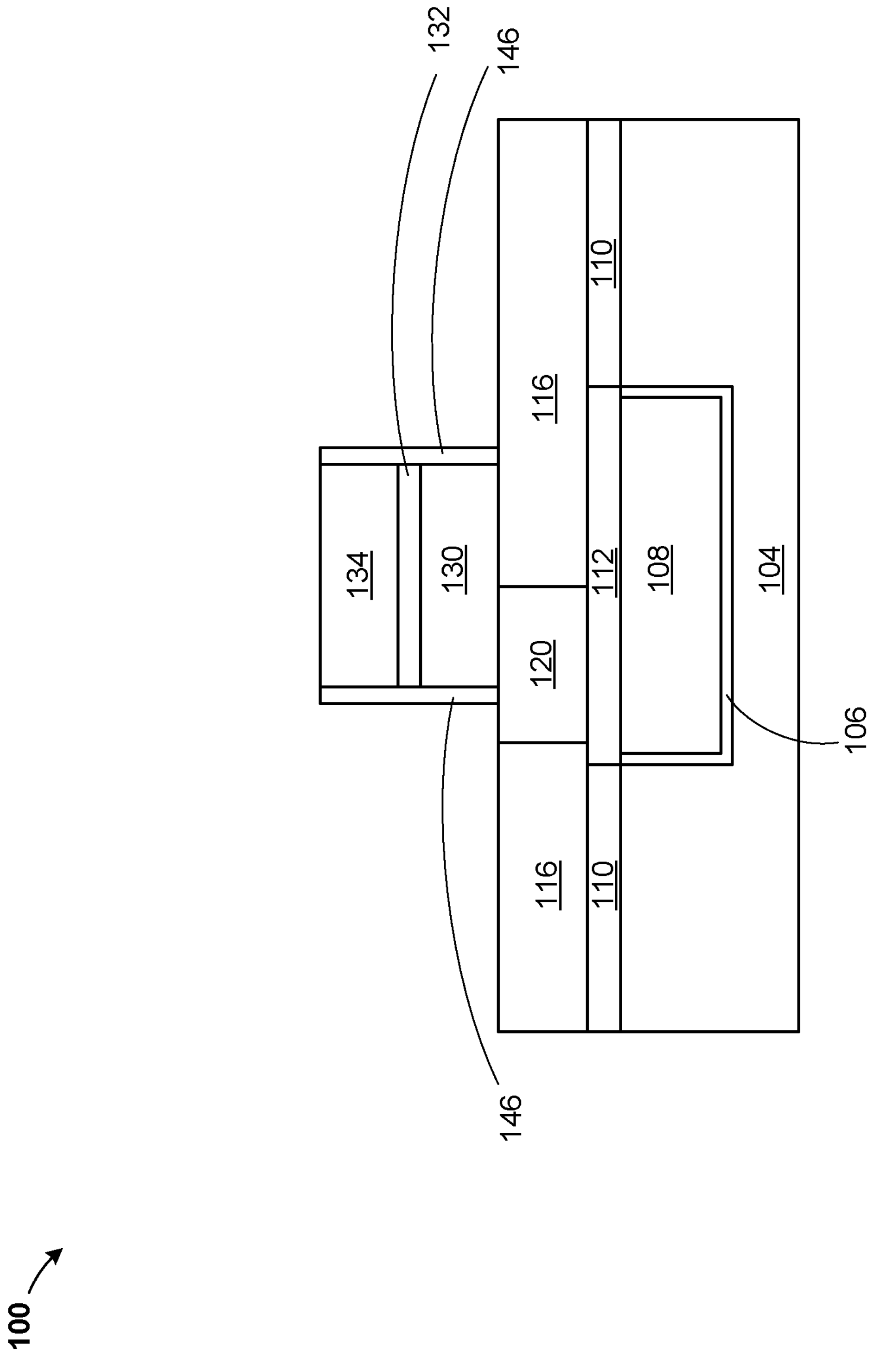
FIG. 11 illustrates a cross-sectional view along section line X-X of the semiconductor structure and illustrates removal of portions of the encapsulation layer, according to an exemplary embodiment.

Referring now to FIG. 11, a cross-sectional view along section line X-X of the structure 100 is shown, according to an embodiment. Portions of the encapsulation layer 146 may be removed.

The portions of the encapsulation layer 146 may be selectively removed using an anisotropic etching technique, such as, for example, reactive ion etching. The remaining portions of the encapsulation layer 146 may remain vertically aligned directly adjacent to the reference layer 124, the tunneling barrier 132 and the free layer 134. The encapsulation layer 146 may be removed from upper horizontal surfaces of the reference layer 124, the sacrificial layer 120 and the ILD 116.

Figure 12:
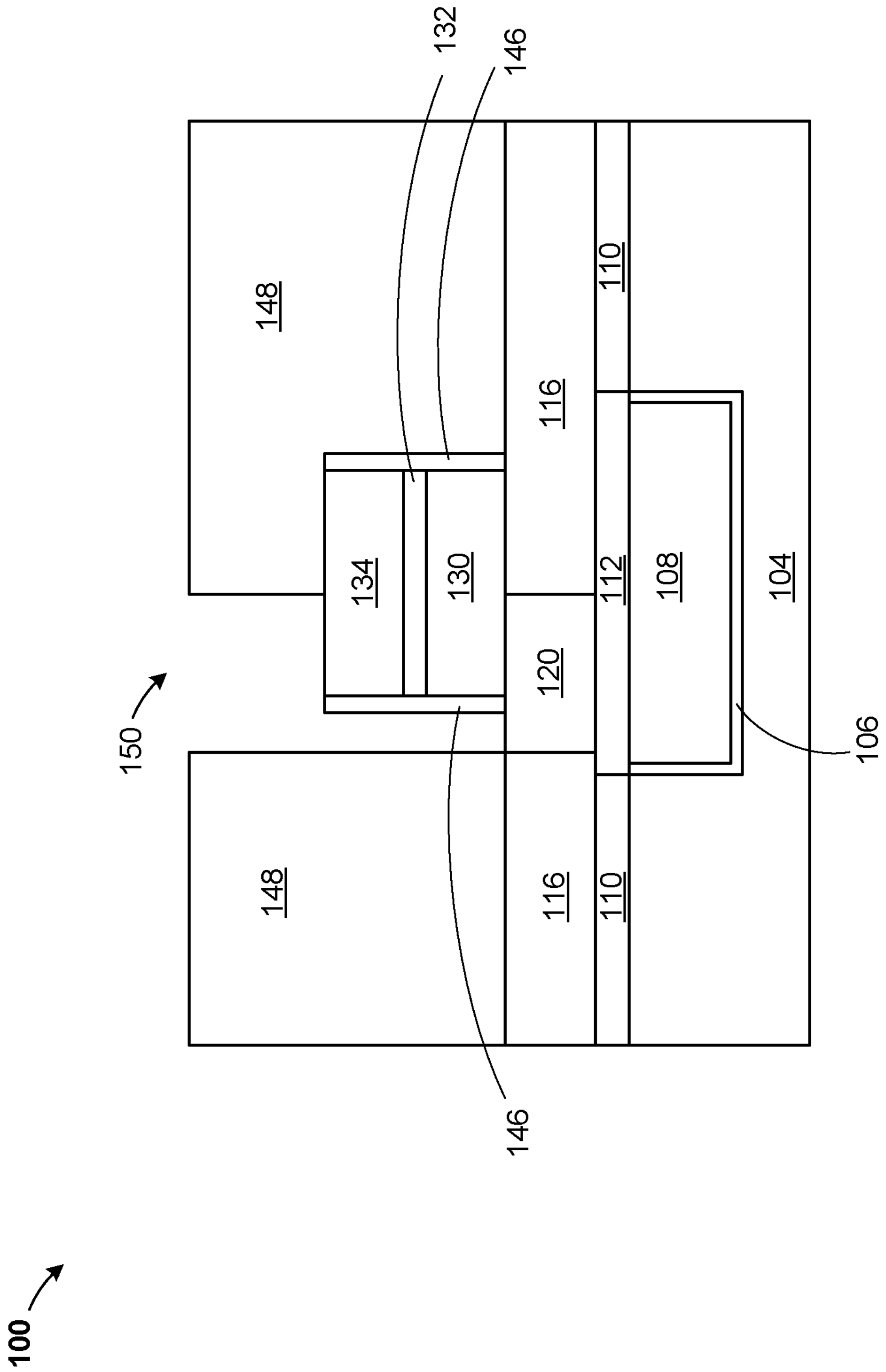
FIG. 12 illustrates a cross-sectional view along section line X-X of the semiconductor structure and illustrates formation of a second inter-layer dielectric and an opening in the second inter-layer dielectric, according to an exemplary embodiment.

Referring now to FIG. 12, a cross-sectional view of the structure 100 is shown, according to an embodiment. An inter-layer dielectric (hereinafter "ILD") 148 may be formed.

The ILD 148 may be formed as described for the ILD 104, conformally on the structure 100, covering an upper horizontal surface and vertical side surfaces of the encapsulation layer 146, an upper horizontal surface of the free layer 134, a portion of an upper horizontal surface of the sacrificial layer 120 and an upper horizontal surface of the ILD 116.

A planarization process, such as, for example, chemical mechanical polishing (CMP), may be done to remove excess material from an upper horizontal surface of the structure 100 such that upper horizontal surfaces of the ILD 148 are coplanar.

Portions of the ILD 148 may be selectively removed or recessed using an anisotropic etching technique, such as, for example, reactive ion etching, forming an opening 150. The removal of the portions of the ILD 148 may expose a first vertical side surface and an upper horizontal surface of the encapsulation layer 146, a portion of an upper horizontal surface of the sacrificial layer 120 and a portion of the upper horizontal surface of the free layer 134.

Figure 13:
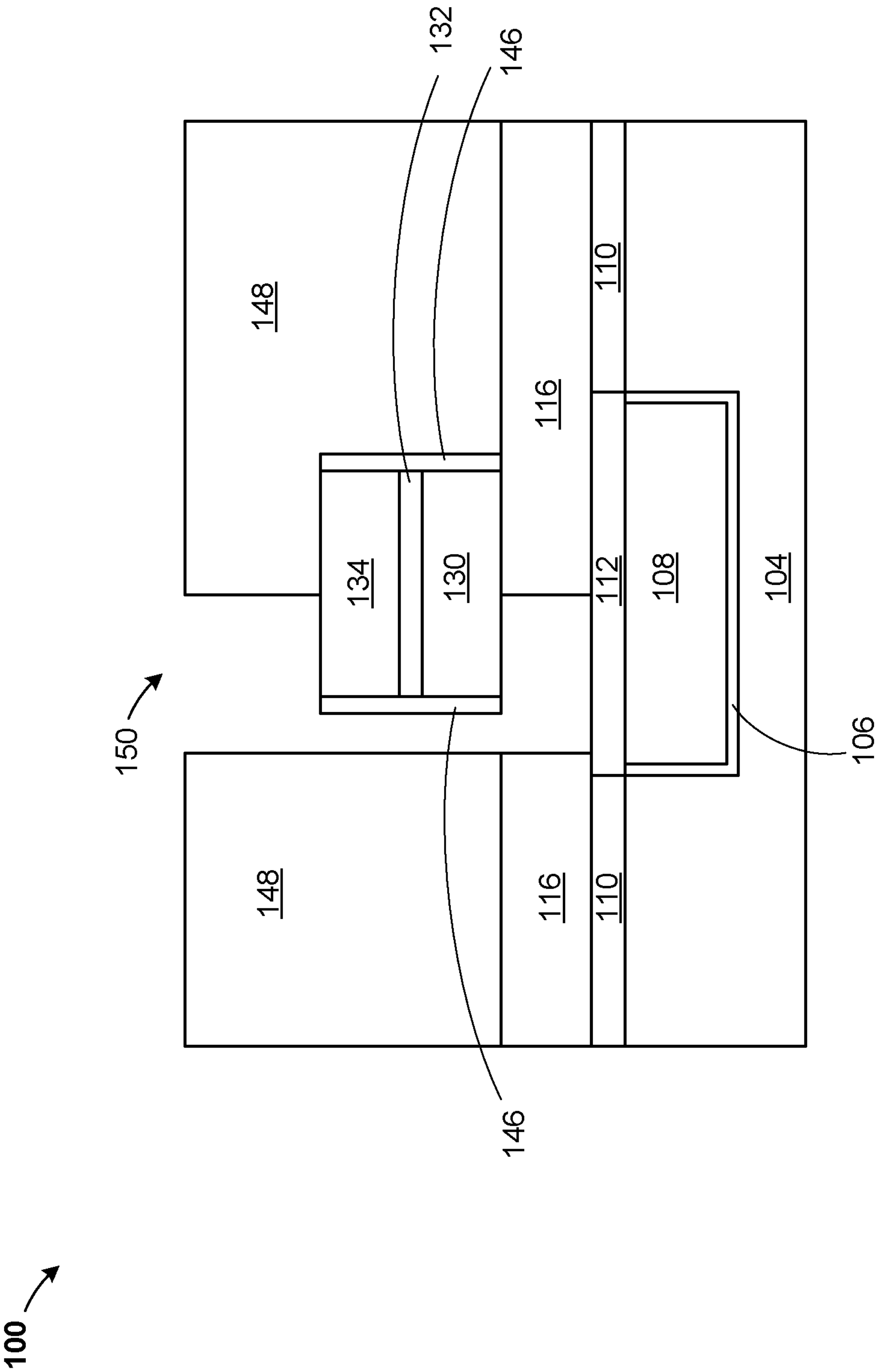
FIG. 13 illustrates a cross-sectional view along section line X-X of the semiconductor structure and illustrates removal of the sacrificial layer, according to an exemplary embodiment.

Referring now to FIG. 13, a cross-sectional view of the structure 100 is shown, according to an embodiment. The sacrificial layer 120 may be removed, increasing the opening 150.

The sacrificial layer 120 may be removed by a reactive ion etch (RIE) process or a selective wet etch process from below a portion of the MTJ stack. The MTJ stack of the reference layer 130, the tunneling barrier 130 and the free layer 134 has a portion supported by the ILD 116 and has a remaining portion which is not supported below and overhangs into the opening 150.

The sacrificial layer 120 may be selectively removed, selective to the ILD 148, the encapsulation layer 146, the reference layer 130, the free layer 134, the ILD 116 and the metal cap 112. A lower horizontal surface of the first vertical side surface of the encapsulation layer, a portion of a lower horizontal surface of the reference layer 130, and a portion of an upper horizontal surface of the metal cap 112 are exposed in the opening 150.

Figure 14:
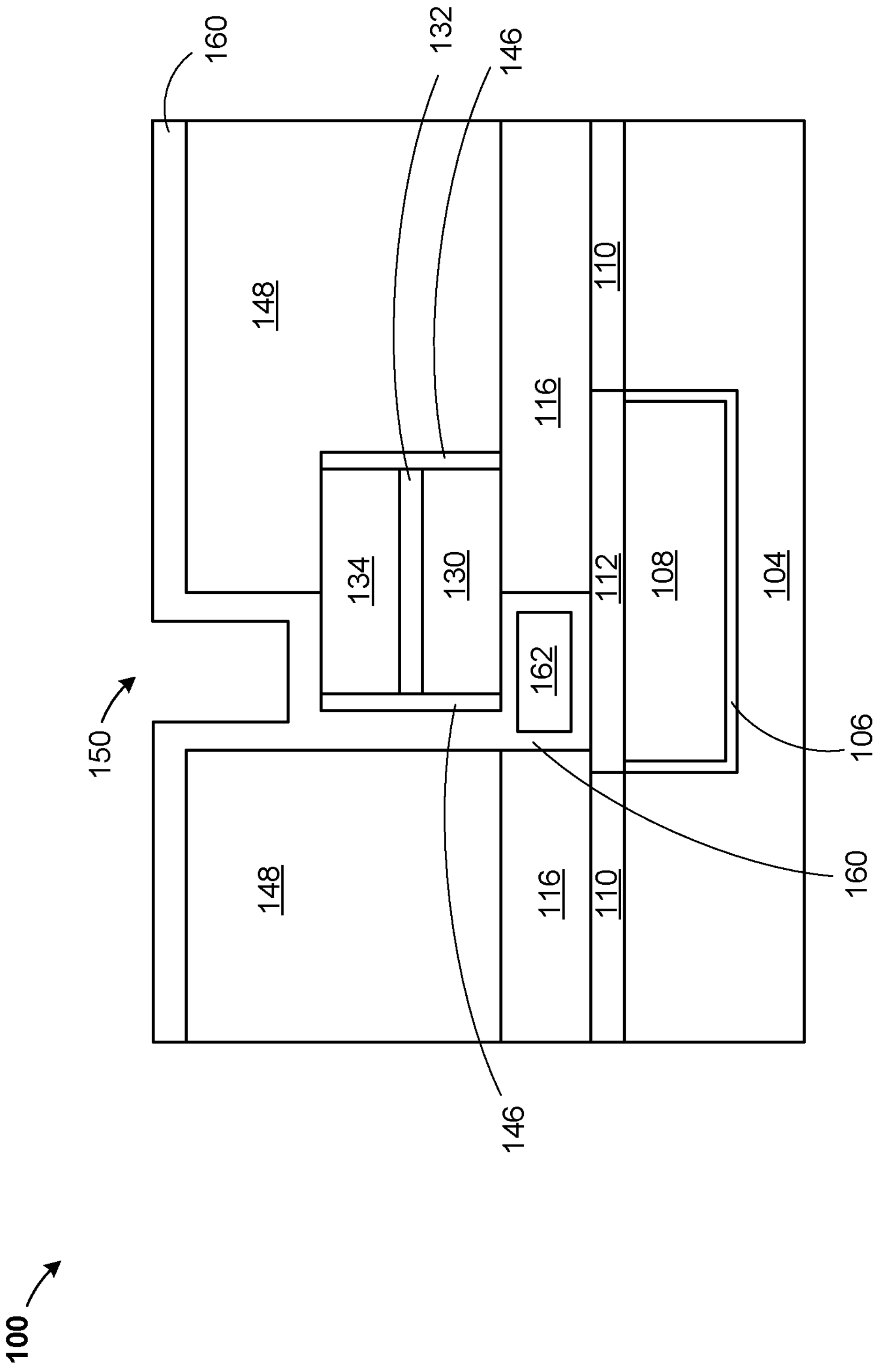
FIG. 14 illustrates a cross-sectional view along section line X-X of the semiconductor structure and illustrates formation of a metal liner, according to an exemplary embodiment.

Referring now to FIG. 14, a cross-sectional view of the structure 100 is shown, according to an embodiment. A metal liner 160 may be formed.

The metal liner 160 may be composed of, for example, metal nitride, such as titanium nitride (TiN), titanium tungsten nitride (TiWN), or a combination thereof. A metal nitride material will not be reactive with the surrounding dielectrics.

The metal liner 160 may be deposited utilizing a conventional deposition process such as, for example, CVD, plasma enhanced chemical vapor deposition (PECVD), PVD or ALD. The metal liner 160 may be 5 nm thick, although a thickness less than or greater than 5 nm may be acceptable. The metal liner 160 partially fills the opening 150. The metal liner 160 may form along edges of the opening 150 which is below the MTJ stack of reference layer 130, the tunneling barrier 132 and the free layer 134. The metal liner 160 may form on the upper horizontal of the portion of the metal cap 112 which is exposed, along vertical side surfaces of the ILD 116 and on the lower horizontal surface of the reference layer 130. The metal liner 160 may fill a portion of the opening 150 between the encapsulation layer 146 and the ILD 148. The metal liner 160 may line an upper horizontal surface of the reference layer 134 and vertical side surfaces of the ILD 148 in the opening 150 forming a bottom electrode. The metal liner 160 may be on an upper horizontal surface of the ILD 148.

The metal liner 160 lines all horizontal and vertical surfaces where the sacrificial layer 120 was removed forming the bottom electrode below the MTJ stack, and partially overlapping the MTJ stack. In an embodiment, there is a void 162 within the metal liner 160 below the MTJ stack. The bottom electrode is hollow.

The void 162 is a consequence of the width of the opening 150 adjacent to the vertical encapsulation layer 146, and of the conformal metal liner 160 deposition. Due to the narrow width of opening 150 adjacent to vertical encapsulation layer 146, this narrow width will be completely filled by metal liner 160. Due to the larger width of opening 150 adjacent to ILD 116, this portion of opening 150 will not be completely filled by metal liner 160. As a result, a hollow bottom electrode is formed.

In an alternate embodiment, there is no void 162 and the metal liner 160 fills the opening where the sacrificial layer 120 was removed.

Figure 15:
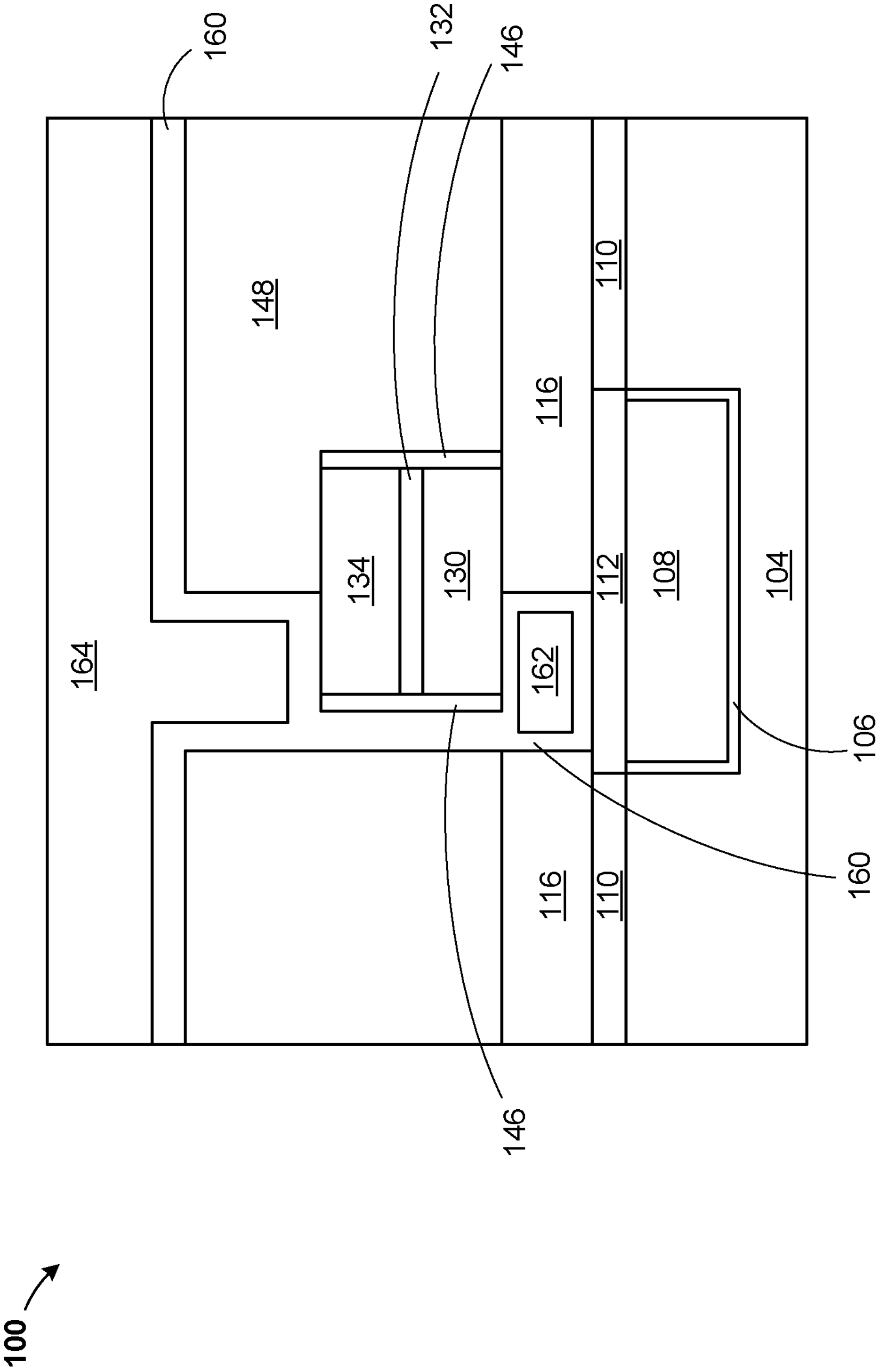
FIG. 15 illustrates a cross-sectional view along section line X-X of the semiconductor structure and illustrates formation of a metal fill, according to an exemplary embodiment.

Referring now to FIG. 15, a cross-sectional view of the structure 100 is shown, according to an embodiment. A metal fill 164 may be formed.

The metal fill 164 is formed from a conductive material layer which is blanket deposited on top of the structure 100, and directly on a top surface of the metal liner 160, filling a remaining portion of the opening 150. The conductive material layer may include materials such as, for example copper (Cu), ruthenium (Ru), tungsten (W). The conductive material can be formed by for example, chemical vapor deposition (CVD), physical vapor deposition (PVD), and atomic layer deposition (ALD) or a combination thereof. The metal fill 164 is formed by damascene, or patterned from the conductive material layer, using known patterning and etching techniques.

Figure 16:
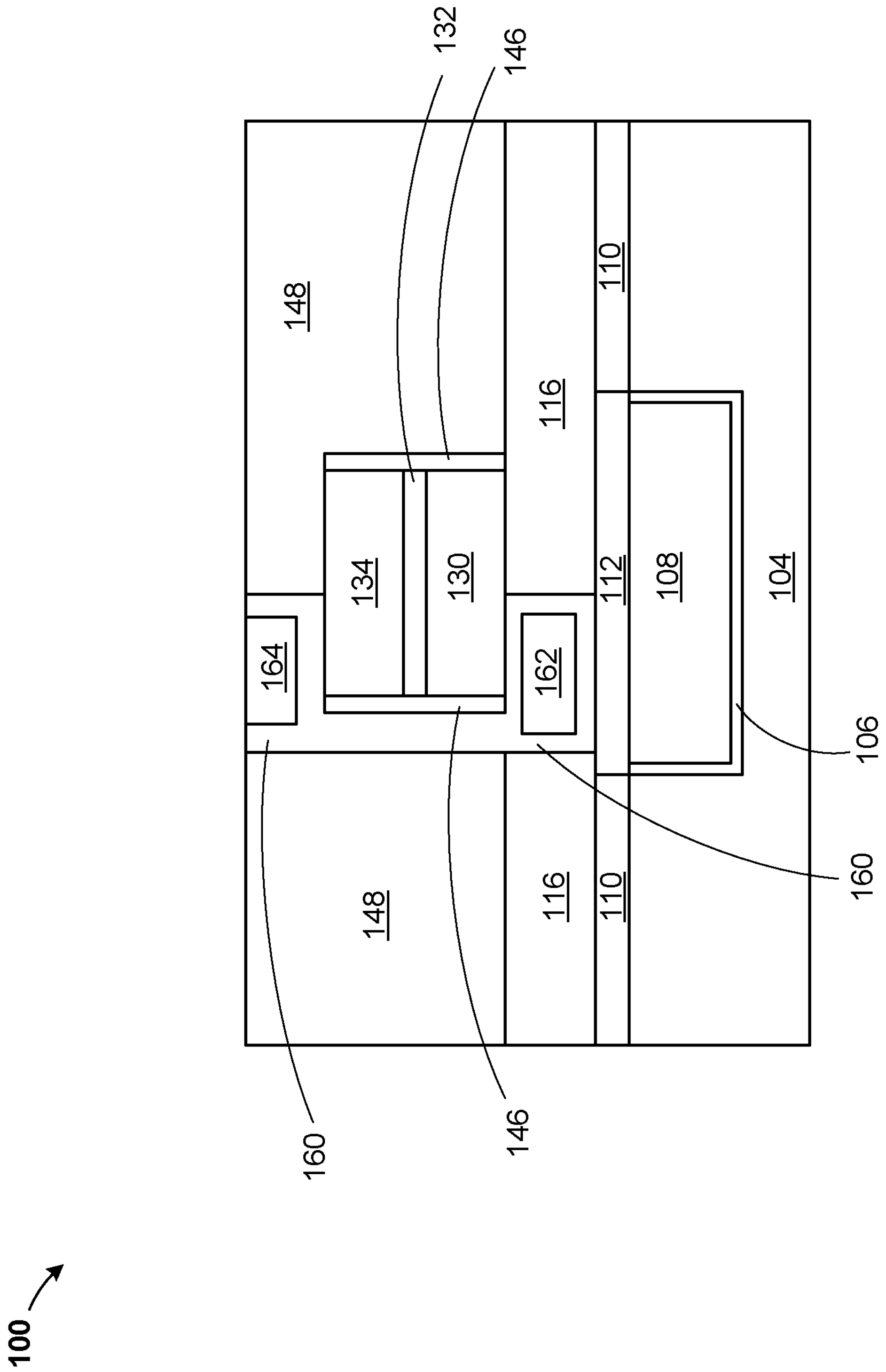
FIG. 16 illustrates a cross-sectional view along section line X-X of the semiconductor structure and illustrates planarization of the semiconductor structure, according to an exemplary embodiment.

Referring now to FIG. 16, a cross-sectional view of the structure 100 is shown, according to an embodiment.

A planarization process, such as, for example, chemical mechanical polishing (CMP), may be done to remove excess material from a top surface of the structure 100 such that upper horizontal surfaces of the metal fill 164, the metal liner 160 and the ILD 148 are coplanar.

Figure 17:
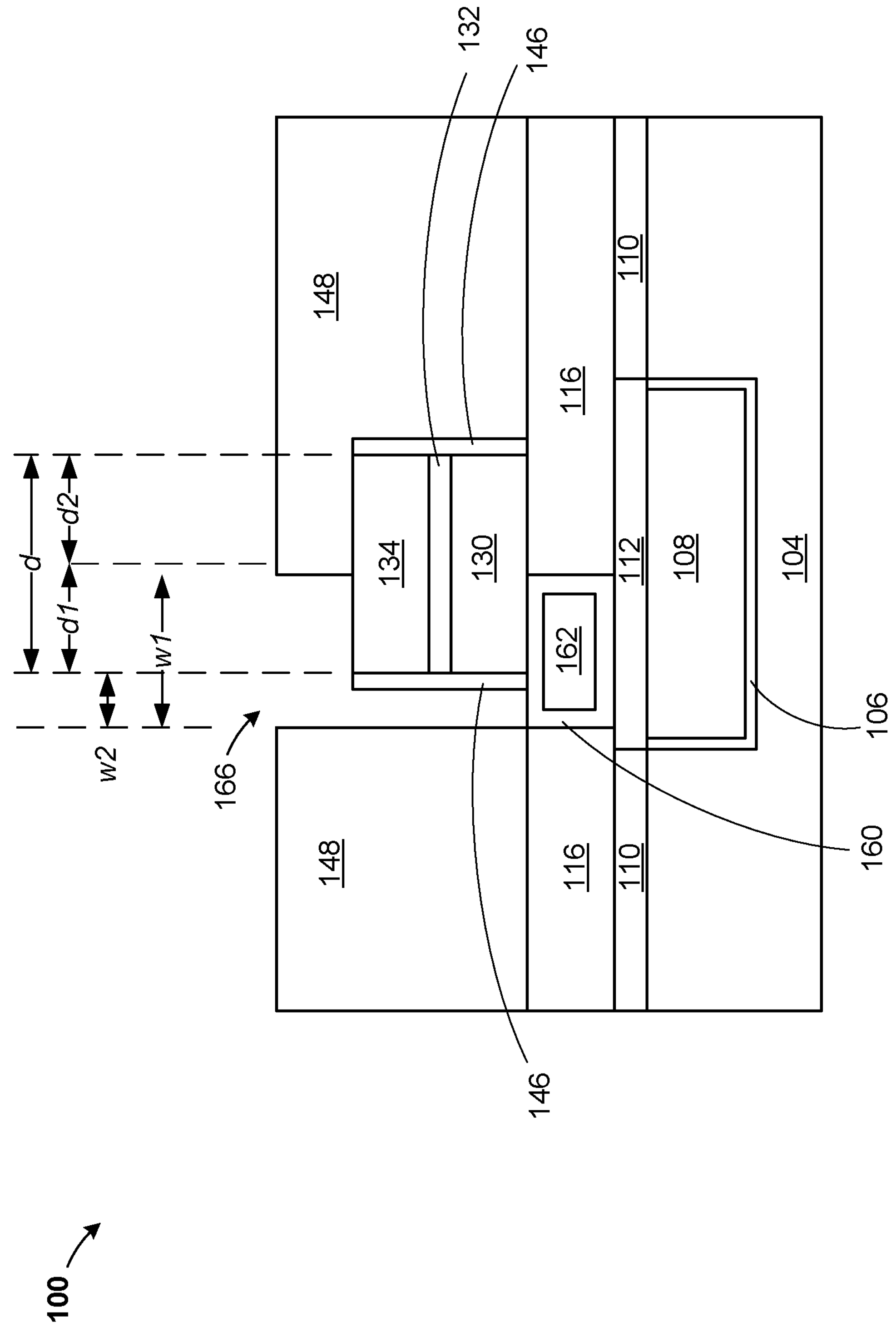
FIG. 17 illustrates a cross-sectional view along section line X-X of the semiconductor structure and illustrates removal of the metal fill and portions of the metal liner, according to an exemplary embodiment.

Referring now to FIG. 17, a cross-sectional view of the structure 100 is shown, according to an embodiment. The metal fill 164 and portions of the metal liner 160 may be removed.

The metal fill 164 and the portions of the metal liner 160 may be removed, selective to the ILD 148, the encapsulation layer 146, the reference layer 134, such that the metal liner below the MTJ stack remains surrounding the void 152.

The metal liner 160 may be partially removed by using a RIE process and further removed by methods known in the arts.

The MTJ stack may have a diameter of d. The diameter d of the MTJ stack may equal d1 plus d2, where d1 is a first part of the diameter and d2 is a second part of the diameter. In an embodiment d1 may be equal to d2, or may be a radius of the MTJ stack.

The bottom electrode may have a width of w1. The bottom electrode may overlap a portion of the MTJ stack for a distance of d1. The bottom electrode may extend beyond the MTJ stack a distance of w2. The width of the bottom electrode w1 is equal to the overlap d1 plus the extended distance w2.

The bottom electrode has a first portion which is vertically aligned with and below a first portion of the MTJ stack. The bottom electrode has a remaining portion which extends beyond and is not below the MTJ stack. A remaining portion of the MTJ stack is vertically aligned with and directly above a portion of the ILD 116. The remaining portion of the MTJ stack is not aligned with the bottom electrode. The MTJ stack is vertically aligned with the lower metal wire 108. The first portion of the bottom electrode is vertically aligned with and directly between the lower metal wire 108 and the MTJ stack. The remaining portion of the bottom electrode is vertically aligned with and directly between the lower metal wire 108 and the ILD 170. The first portion of the MTJ stack is vertically aligned with and directly above the lower metal wire 108 and the bottom electrode. The remaining portion of the MTJ stack is vertically aligned with and directly above the lower metal wire 108 and the ILD 116.

The remaining portion of the MTJ stack is vertically aligned with the lower metal wire 108, the ILD 116 is sandwiched between the remaining portion of the MTJ stack and the lower metal wire 108.

Figure 18:
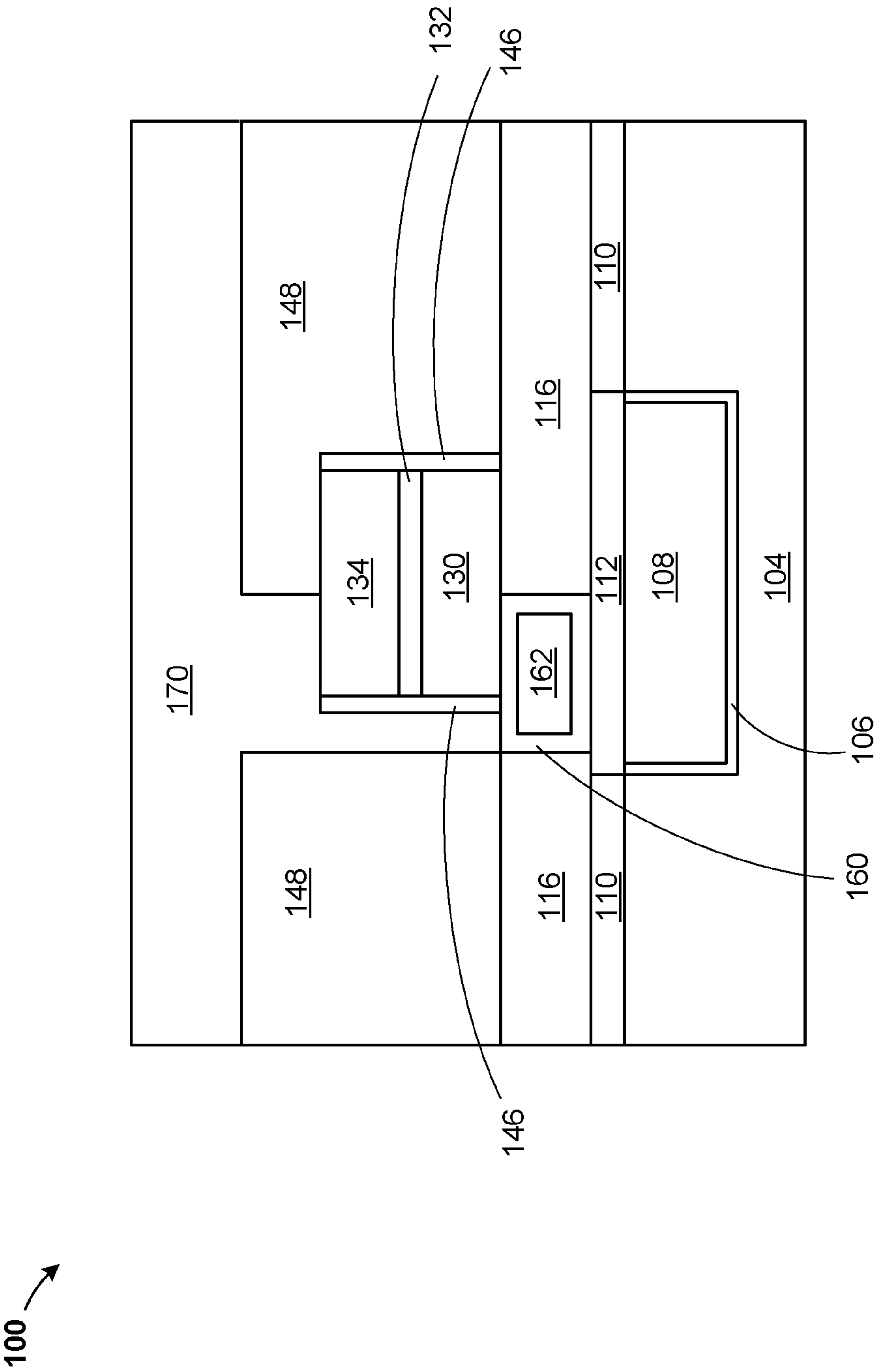
FIG. 18 illustrates a cross-sectional view along section line X-X of the semiconductor structure and illustrates formation of a third inter-layer dielectric, according to an exemplary embodiment.

Referring now to FIG. 18, a cross-sectional view of the structure 100 is shown, according to an embodiment. An inter-layer dielectric (hereinafter "ILD") 170 may be formed.

The ILD 170 may be formed by a conformal dielectric deposition process, such as CVD or ALD. In a preferred embodiment, the ILD 170 may include zirconium oxide ($ZrO_2$), which will provide a metal-oxide dielectric material which is not reactive with the surrounding materials.

Figure 19:
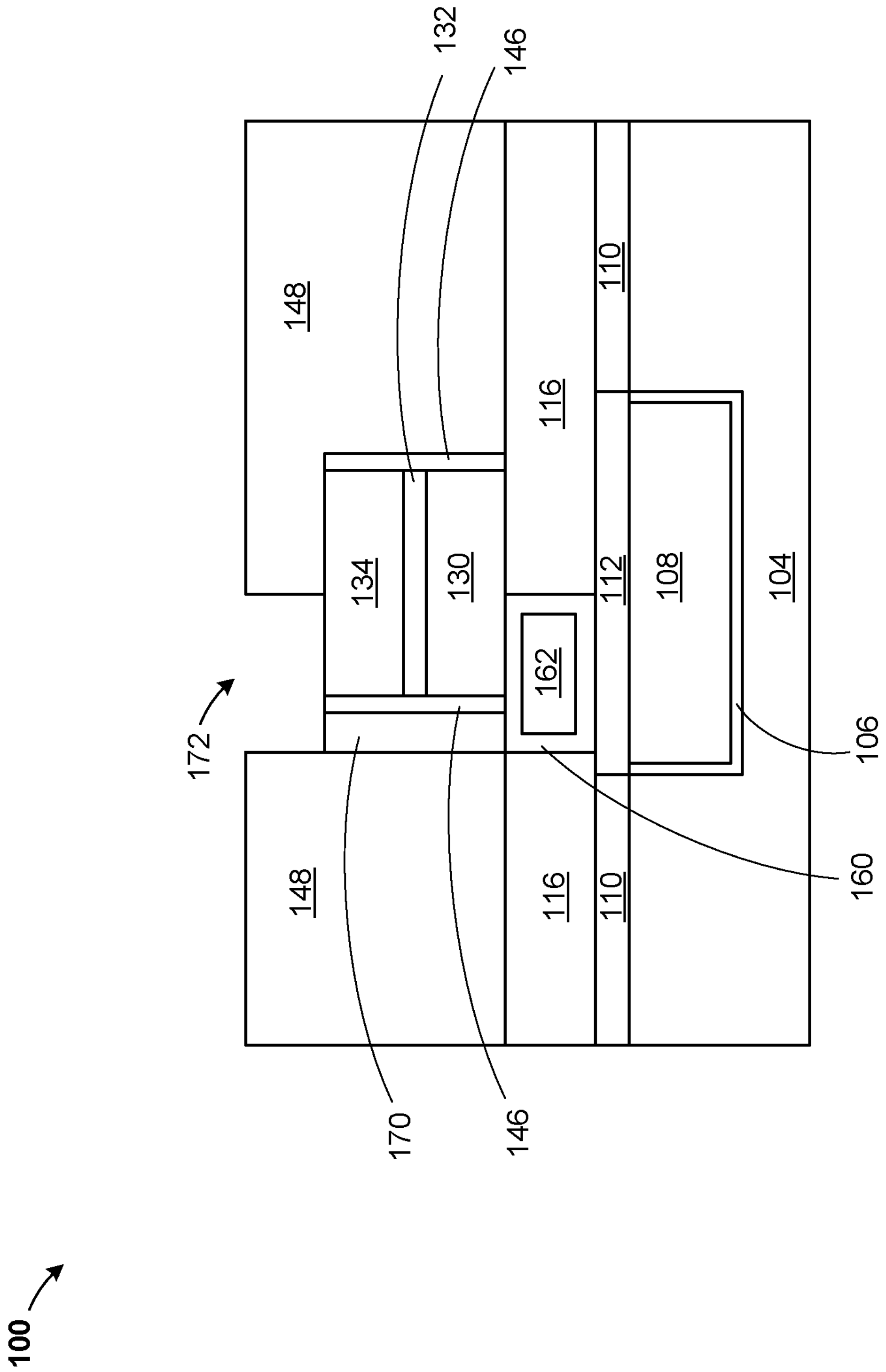
FIG. 19 illustrates a cross-sectional view of the semiconductor structure and illustrates removal of portions of the third inter-layer dielectric, according to an exemplary embodiment.

Referring now to FIG. 19, a cross-sectional view of the structure 100 is shown, according to an embodiment. Portions of the ILD 170 may be removed.

A planarization process, such as, for example, chemical mechanical polishing (CMP), may be done to remove excess material from a top surface of the structure 100 such that upper horizontal surfaces of the ILD 170 and the ILD 148 are coplanar.

Portions of the ILD 170 may be recessed by a selective wet process or a RIE process, exposing a portion of the upper horizontal surface of the free layer 134 and the encapsulation layer 146. A remaining portion of the ILD 170 may have an upper horizontal surface coplanar with the free layer 134 and the encapsulation layer 146. An opening 172 is formed where the portions of the ILD 170 were removed.

Figure 20:
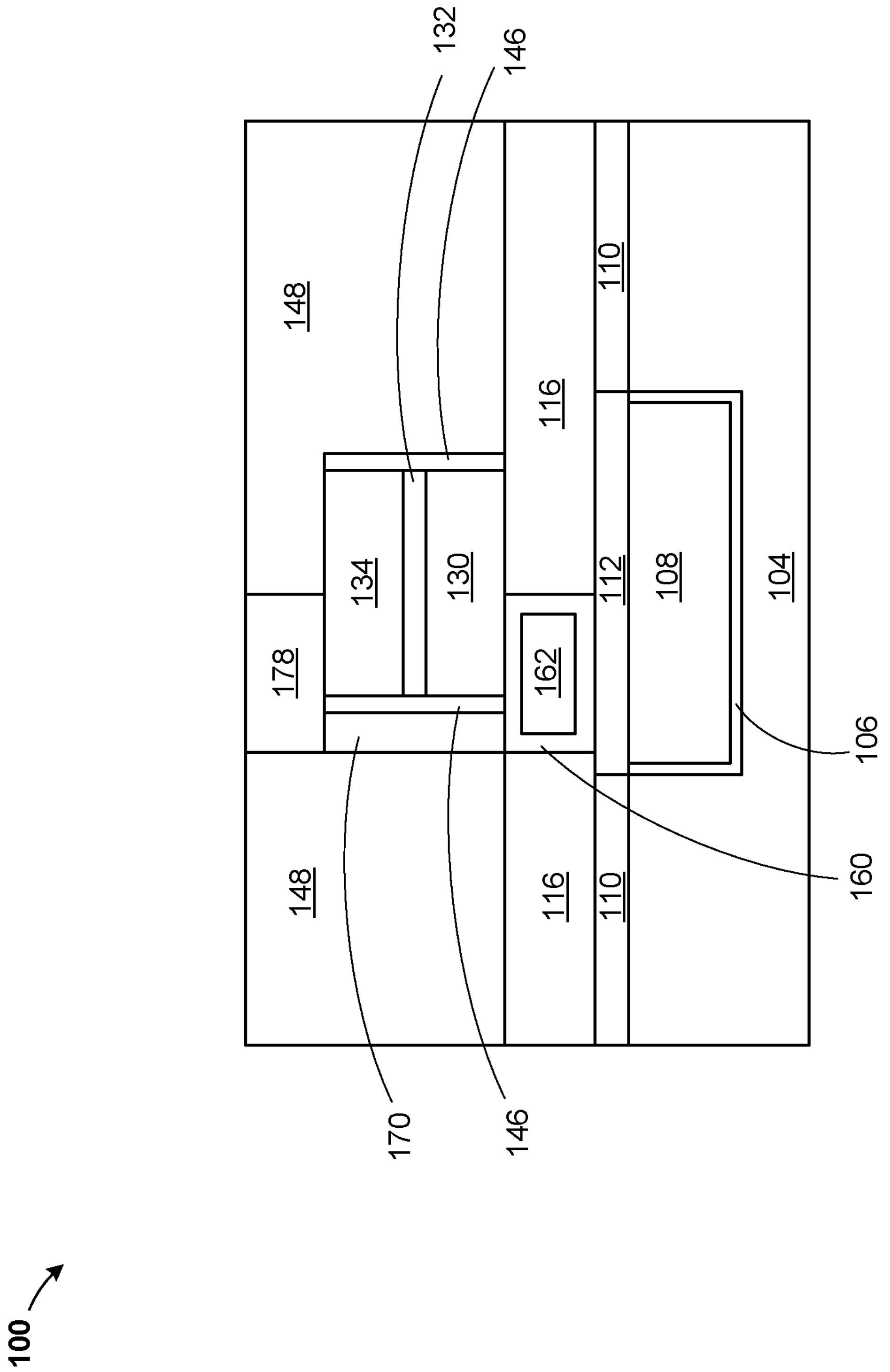
FIG. 20 illustrates a cross-sectional view along section line X-X of the semiconductor structure and illustrates formation of a top electrode, according to an exemplary embodiment.

Referring now to FIG. 20, a cross-sectional view of the structure 100 is shown, according to an embodiment. A top electrode 178 may be formed.

The top electrode 178 is formed from a conductive material layer which is blanket deposited on top of the structure 100, and directly on a top surface of the free layer 134, the encapsulation layer 146 and the ILD 170. The conductive material layer may include materials such as, for example, tungsten (W), platinum (Pt), ruthenium (Ru).

In an embodiment, a metal liner (not shown) may be first formed in the opening 172 and the top electrode 178 may fill a remaining portion of the opening 172. The metal liner (not shown) separates the conductive material of the top electrode 178 from the ILD 148 and the ILD 170. The metal liner (not shown) may be composed of, for example, tantalum nitride (TaN), titanium nitride (TiN), or a combination thereof. These metal liner materials are unreactive with the surrounding materials.

The conductive material layer may be deposited using typical deposition techniques, for example, physical vapor deposition, atomic layer deposition, molecular layer deposition, and chemical vapor deposition.

The metal liner (not shown) may be deposited utilizing a conventional deposition process such as, for example, CVD, plasma enhanced chemical vapor deposition (PECVD), PVD or ALD. The metal liner (not shown) may be 5 nm thick, although a thickness less than or greater than 5 nm may be acceptable. The metal liner (not shown) surrounds a lower horizontal surface and a vertical side surface of the top electrode 178.

A planarization process, such as, for example, chemical mechanical polishing (CMP), may be done to remove excess material from a top surface of the structure 100 such that upper horizontal surfaces of the top electrode 178 and the ILD 148 are coplanar.

In an embodiment, the top electrode 178 may have a thickness ranging from about 10 nm to about 100 nm, although a thickness less than 10 nm and greater than 100 nm may be acceptable. The top electrode 178 is asymmetrically and vertically aligned above the free layer 134, the tunneling barrier 132, the reference layer 130, the metal liner 160, the metal cap 112 and the lower metal wire 108.

As shown in the figures, the top electrode 178 is solid metallic material and the bottom electrode has a void. In an alternate embodiment, the bottom electrode may also be solid metallic material. The latter embodiment includes a wider opening 150 adjacent to vertical encapsulation layer 146.

As shown in the figure, the top electrode 178 has vertical side surfaces aligned with vertical side surfaces of the bottom electrode.

Figure 21:
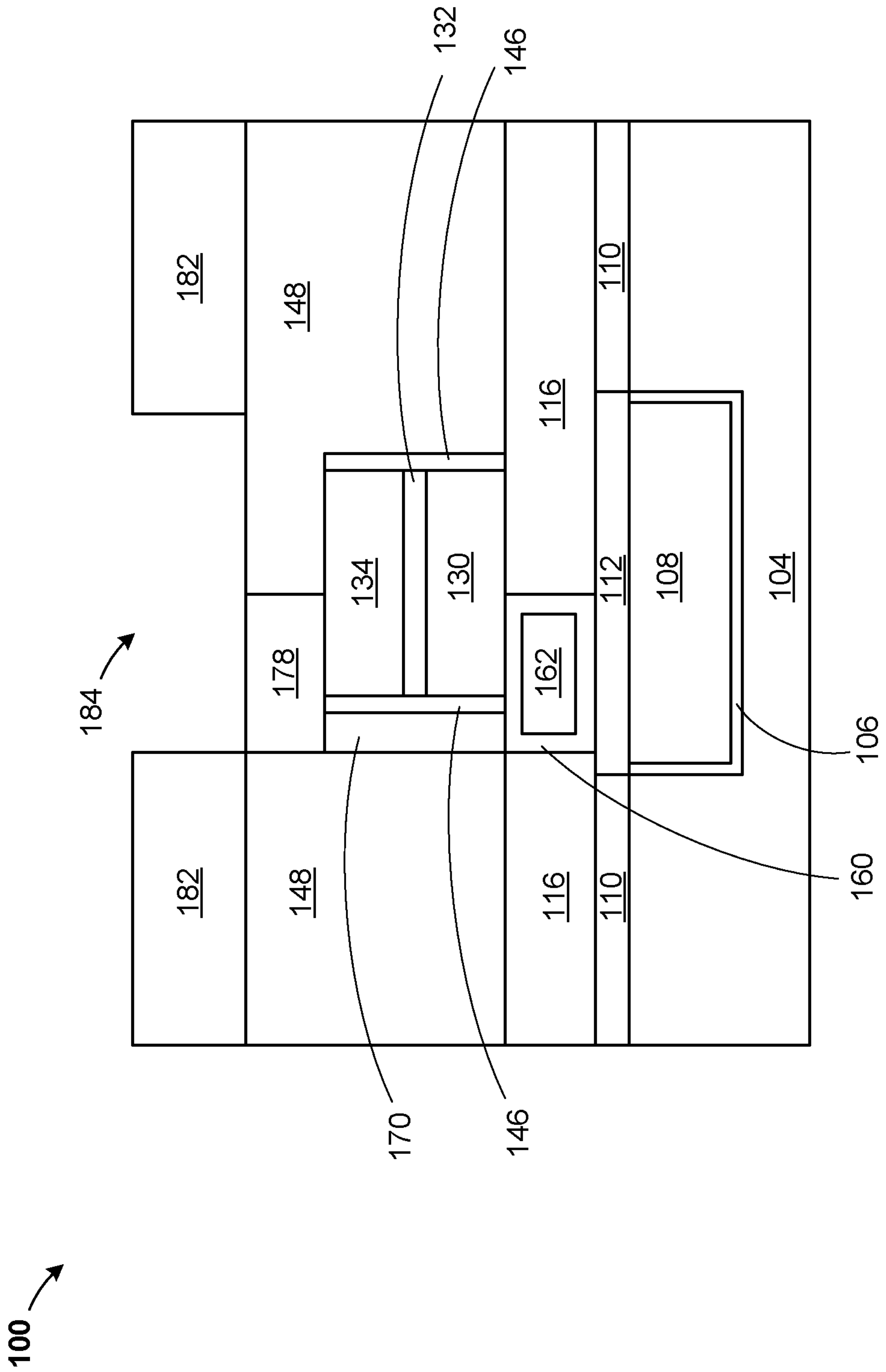
FIG. 21 illustrates a cross-sectional view along section line X-X of the semiconductor structure and illustrates formation of a fourth inter-layer dielectric, according to an exemplary embodiment.

Referring now to FIG. 21, a cross-sectional view of the structure 100 is shown, according to an embodiment. An inter-layer dielectric (hereinafter "ILD") 182 may be formed. A trench 184 may be formed in the ILD 182.

The ILD 182 may be formed as described for the ILD 104, conformally on the structure 100, on upper horizontal surfaces of the top electrode 178 and the ILD 148. The ILD 182 is less likely to contain voids than forming an inter-layer dielectric surrounding multiple layers of the MTJ stack.

The trench 184 may be formed by removing a portion of the ILD 182, exposing an upper horizontal surface of the top electrode 178 and a portion of an upper horizontal surface of the ILD 148, by methods known in the arts.

Figure 22:
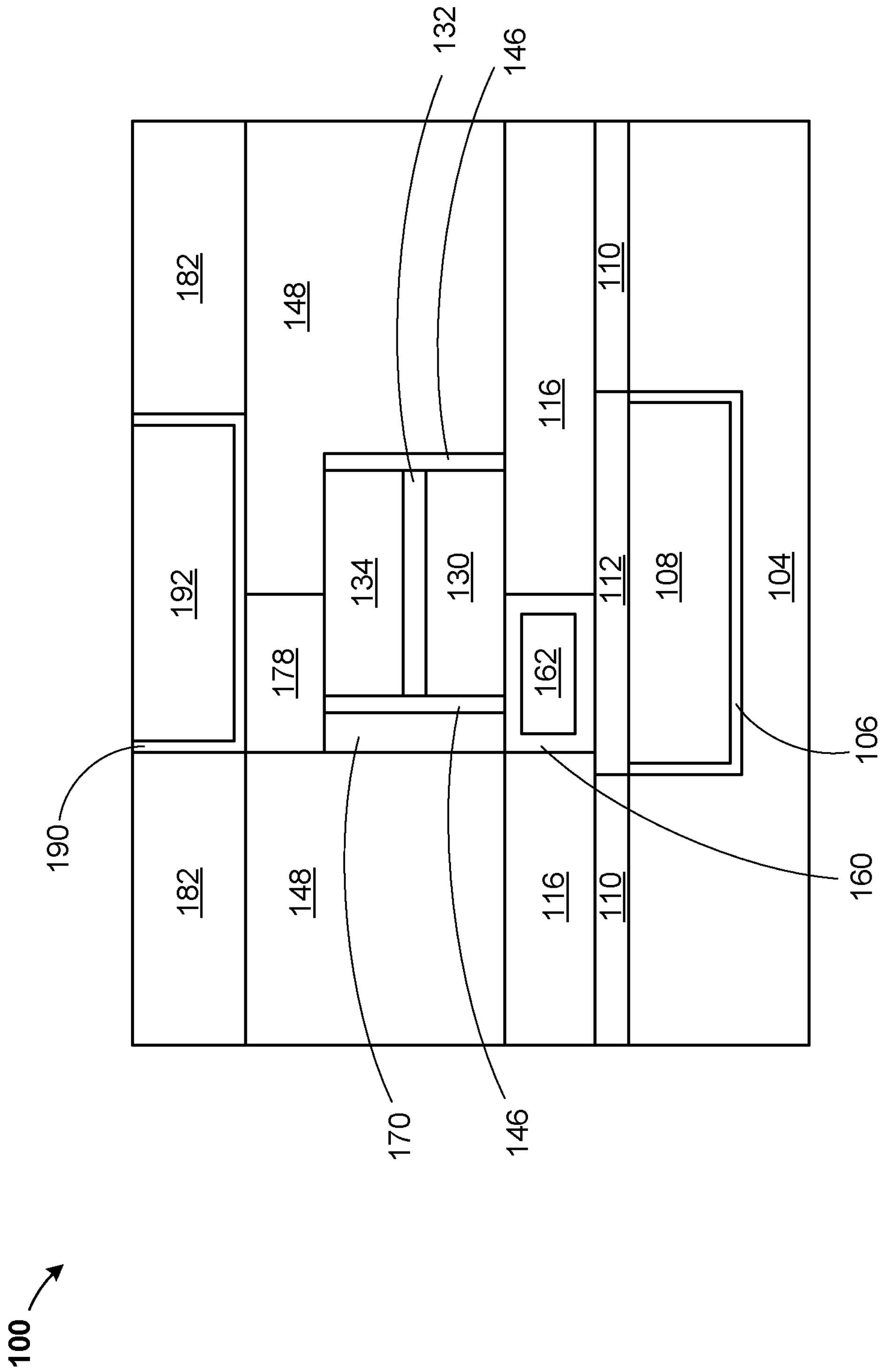
FIG. 22 illustrates a cross-sectional view along section line X-X of the semiconductor structure and illustrates formation of an upper metal wire, according to an exemplary embodiment.

Referring now to FIG. 22, a cross-sectional view of the structure 100 is shown, according to an embodiment. A metal liner 190 may be formed. An upper metal wire 192 may be formed.

The upper metal wire 192 may be formed by lining the trench 184 with the metal liner 190, and filling trench 184.

The metal liner 190 separates the conductive interconnect material of the upper metal wire 192 from the ILD 158. The metal liner 190 may be formed as described for the metal liner 106. The liner 190 surrounds a lower horizontal surface and a vertical side surface of the upper metal wire 192.

The upper metal wire 192 may be formed as described for the lower metal wire 108. There may be any number of openings in the ILD 182, each lined with the metal liner 190 and the upper metal wire 192, on the structure 100.

A planarization process, such as, for example, chemical mechanical polishing (CMP), may be done to remove excess material from a top surface of the structure 100 such that upper horizontal surfaces of the upper metal wire 192, the liner 190 and the ILD 182 are coplanar.

The present invention relates to fabricating a MTJ device with asymmetric electrodes which are both formed after patterning of the MTJ stack reducing a risk of shorts due to metal re-sputtering. The MTJ device has a lower CER by using a dielectric for patterning of the MTJ pillar.

Embodiments of this invention include a semiconductor device including a magnetic tunnel junction (MTJ) stack and a bottom electrode below the MTJ stack, where a portion of a bottom electrode is vertically aligned with a portion of the MTJ stack and a remaining portion of the bottom electrode extends horizontally beyond the MTJ stack.

An embodiment includes a top electrode above the MTJ stack, where the top electrode includes a solid interior, where the bottom electrode includes an interior void. An embodiment includes where the top electrode and the bottom electrode each includes vertical side surfaces vertically aligned with each other. An embodiment includes where a portion of the top electrode is vertically aligned with the portion of the MTJ stack and a remaining portion of the top electrode extends horizontally beyond the MTJ stack. An embodiment includes an inter-layer dielectric including zirconium oxide (ZrO2) vertically aligned with and between the remaining portion of the bottom electrode and the remaining portion of the top electrode.

An embodiment where the MTJ stack includes a reference layer, a tunneling barrier and a free layer.

An embodiment where a remaining portion of the MTJ stack is vertically aligned with a lower metal wire, where an inter-layer dielectric is sandwiched between the remaining portion of the MTJ stack and the lower metal wire.

An embodiment where the bottom includes a metal nitride.

Embodiments of this invention include a semiconductor device including a magnetic tunnel junction (MTJ) stack and a bottom electrode below the MTJ stack, where a portion of a bottom electrode is vertically aligned with a portion of the MTJ stack and a remaining portion of the bottom electrode extends horizontally beyond the MTJ stack, where the bottom electrode includes an interior void.

An embodiment including a top electrode, where the top electrode and the bottom electrode each include vertical side surfaces vertically aligned with each other.

An embodiment including a top electrode, where a portion of the top electrode is vertically aligned with the portion of the MTJ stack and a remaining portion of the top electrode extends horizontally beyond the MTJ stack.

An embodiment including an inter-layer dielectric including zirconium oxide ($ZrO_2$) vertically aligned with and between the remaining portion of the bottom electrode and the remaining portion of the top electrode.

An embodiment where the MTJ stack includes a reference layer, a tunneling barrier and a free layer.

An embodiment where a remaining portion of the MTJ stack is vertically aligned with a lower metal wire, where an inter-layer dielectric is sandwiched between the remaining portion of the MTJ stack and the lower metal wire.

An embodiment where the bottom electrode includes a metal nitride.

Embodiments of this invention include forming a magnetic tunnel junction (MTJ) stack on a sacrificial layer, a portion of a sacrificial layer is vertically aligned with a portion of the MTJ stack and a remaining portion of the sacrificial layer extends horizontally beyond the MTJ stack.

An embodiment including forming a bottom electrode below the MTJ stack after forming the MTJ stack, where the bottom electrode is hollow. An embodiment including forming a top electrode above the MTJ stack, where a portion of the top electrode is vertically aligned with the portion of the MTJ stack and a remaining portion of the top electrode extends horizontally beyond the MTJ stack. An embodiment including an inter-layer dielectric including zirconium oxide (ZrO2) vertically aligned with and between the remaining portion of the bottom electrode and the remaining portion of the top electrode. An embodiment where the bottom electrode includes a metal nitride.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiment, the practical application or technical improvement over technologies found in the marketplace, or to enable others of ordinary skill in the art to understand the embodiments disclosed herein.

What is claimed is:

1. A semiconductor device comprising:

a magnetic tunnel junction (MTJ) stack;

a bottom electrode below the MTJ stack, wherein a portion of a bottom electrode is vertically aligned with a portion of the MTJ stack and a remaining portion of the bottom electrode extends horizontally beyond the MTJ stack; and a top electrode above the MTJ stack, wherein the top electrode comprises a solid interior, wherein the bottom electrode comprises an interior void.

2. The semiconductor device according to claim 1, wherein the top electrode and the bottom electrode each comprise vertical side surfaces vertically aligned with each other.

3. The semiconductor device according to claim 1, wherein a portion of the top electrode is vertically aligned with the portion of the MTJ stack and a remaining portion of the top electrode extends horizontally beyond the MTJ stack.

4. The semiconductor device according to claim 3, further comprising:

an inter-layer dielectric comprising zirconium oxide (ZrO2) vertically aligned with and between the remaining portion of the bottom electrode and the remaining portion of the top electrode.

5. The semiconductor device according to claim 1, wherein the MTJ stack comprises a reference layer, a tunneling barrier and a free layer.

6. The semiconductor device according to claim 1, wherein a remaining portion of the MTJ stack is vertically aligned with a lower metal wire, wherein an inter-layer dielectric is sandwiched between the remaining portion of the MTJ stack and the lower metal wire.

7. The semiconductor device according to claim 1, wherein the bottom electrode comprises a metal nitride.

8. A semiconductor device comprising:

a magnetic tunnel junction (MTJ) stack; and a bottom electrode below the MTJ stack, wherein a portion of a bottom electrode is vertically aligned with a portion of the MTJ stack and a remaining portion of the bottom electrode extends horizontally beyond the MTJ stack, wherein the bottom electrode comprises an interior void.

9. The semiconductor device according to claim 8, further comprising:

a top electrode, wherein the top electrode and the bottom electrode each comprise vertical side surfaces vertically aligned with each other.

10. The semiconductor device according to claim 8, further comprising:

a top electrode, wherein a portion of the top electrode is vertically aligned with the portion of the MTJ stack and a remaining portion of the top electrode extends horizontally beyond the MTJ stack.

11. The semiconductor device according to claim 10, further comprising:

an inter-layer dielectric comprising zirconium oxide (ZrO2) vertically aligned with and between the remaining portion of the bottom electrode and the remaining portion of the top electrode.

12. The semiconductor device according to claim 8, wherein the MTJ stack comprises a reference layer, a tunneling barrier and a free layer.

13. The semiconductor device according to claim 8, wherein a remaining portion of the MTJ stack is vertically aligned with a lower metal wire, wherein an inter-layer dielectric is sandwiched between the remaining portion of the MTJ stack and the lower metal wire.

14. The semiconductor device according to claim 8, wherein the bottom electrode comprises a metal nitride.

15. A method comprising:

forming a magnetic tunnel junction (MTJ) stack on a sacrificial layer, a portion of a sacrificial layer is vertically aligned with a portion of the MTJ stack and a remaining portion of the sacrificial layer extends horizontally beyond the MTJ stack; and forming a bottom electrode below the MTJ stack after forming the MTJ stack, wherein the bottom electrode is hollow.

16. The method according to claim 15, further comprising:

forming a top electrode above the MTJ stack, wherein a portion of the top electrode is vertically aligned with the portion of the MTJ stack and a remaining portion of the top electrode extends horizontally beyond the MTJ stack.

17. The method according to claim 16, further comprising:

an inter-layer dielectric comprising zirconium oxide (ZrO2) vertically aligned with and between a portion of the bottom electrode and the remaining portion of the top electrode.

18. The method according to claim 15, wherein the bottom electrode comprises a metal nitride.

* * * * *